United States Patent
Wen et al.

(10) Patent No.: US 9,601,377 B2
(45) Date of Patent: Mar. 21, 2017

(54) FINFET FORMATION PROCESS AND STRUCTURE

(71) Applicant: Taiwan Semiconductor Manufacturing Company, Ltd., Hsin-Chu (TW)

(72) Inventors: Tsung-Yao Wen, Hsin-Chu (TW); Sai-Hooi Yeong, Zhubei (TW); Sheng-Chen Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/517,553

(22) Filed: Oct. 17, 2014

(65) Prior Publication Data

US 2016/0111334 A1 Apr. 21, 2016

(51) Int. Cl.
*H01L 21/76* (2006.01)
*H01L 21/8234* (2006.01)
*H01L 27/092* (2006.01)
*H01L 21/8238* (2006.01)

(52) U.S. Cl.
CPC ........ *H01L 21/823412* (2013.01); *H01L 21/823807* (2013.01); *H01L 21/823821* (2013.01); *H01L 27/0924* (2013.01); *H01L 21/823431* (2013.01); *H01L 21/823481* (2013.01)

(58) Field of Classification Search
CPC ..... H01L 51/0072; H01L 33/62; H01L 51/56; H01L 51/5016; C09K 11/025

USPC .......................................... 438/424; 257/190
See application file for complete search history.

(56) References Cited

U.S. PATENT DOCUMENTS

| | | | |
|---|---|---|---|
| 9,142,418 B1* | 9/2015 | Jung | H01L 21/3081 |
| 2004/0262687 A1 | 12/2004 | Jung et al. | |
| 2006/0292772 A1 | 12/2006 | Anderson et al. | |
| 2010/0163842 A1 | 7/2010 | Lai et al. | |
| 2011/0241084 A1 | 10/2011 | Wu et al. | |
| 2013/0234147 A1* | 9/2013 | Wu | H01L 29/66795 257/76 |
| 2014/0213037 A1* | 7/2014 | LiCausi | H01L 21/76224 438/429 |
| 2014/0252469 A1 | 9/2014 | Lee et al. | |
| 2015/0123144 A1* | 5/2015 | Wu | H01L 29/66795 257/76 |

(Continued)

FOREIGN PATENT DOCUMENTS

| | | |
|---|---|---|
| JP | 20100157723 A | 7/2010 |
| KR | 20050001165 A | 1/2005 |

(Continued)

*Primary Examiner* — Andy Huynh
(74) *Attorney, Agent, or Firm* — Slater Matsil, LLP

(57) ABSTRACT

A FinFET and methods for forming a FinFET are disclosed. In a method, first trenches are formed in a substrate. First isolation regions are then formed in the first trenches. An epitaxial region is epitaxially grown between the first isolation regions. A second trench is formed by etching in the epitaxial region, forming a plurality of fins. A second isolation region is formed in the second trench. A structure includes a substrate, a first fin on the substrate, a gate dielectric over the first fin, and a gate electrode over the gate dielectric. The first fin comprises an epitaxial layer having a stacking fault defect density less than $1*10^4$ cm$^{-3}$.

20 Claims, 23 Drawing Sheets

(56) References Cited

U.S. PATENT DOCUMENTS

| | | | | |
|---|---|---|---|---|
| 2015/0179768 A1* | 6/2015 | Chen | ................. | H01L 29/66795 257/401 |
| 2015/0294897 A1* | 10/2015 | Wang | ................ | H01L 21/76224 257/506 |
| 2016/0049467 A1* | 2/2016 | Wu | .................... | H01L 29/0642 257/401 |

FOREIGN PATENT DOCUMENTS

| | | |
|---|---|---|
| KR | 20140110690 A | 9/2014 |
| TW | 201133847 A | 10/2011 |

* cited by examiner

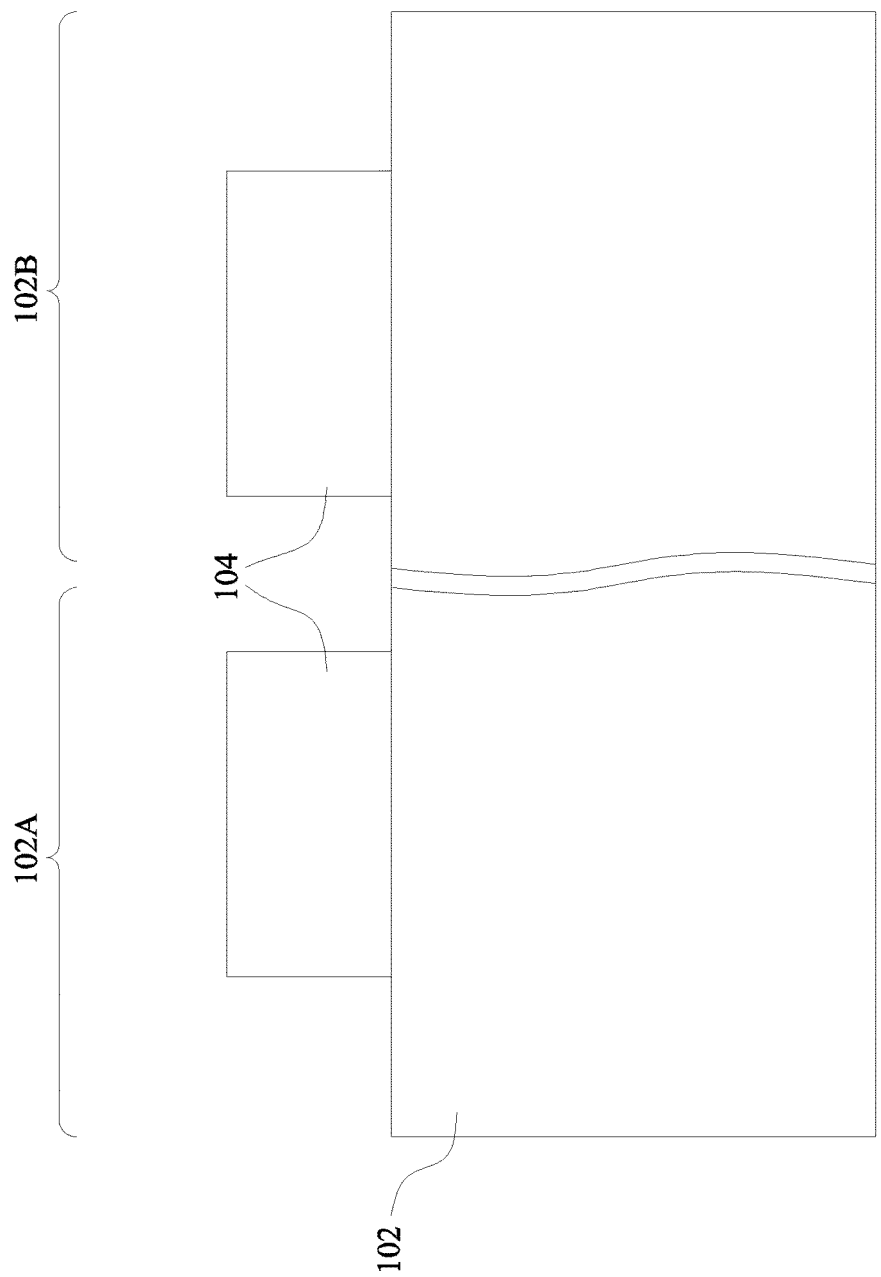

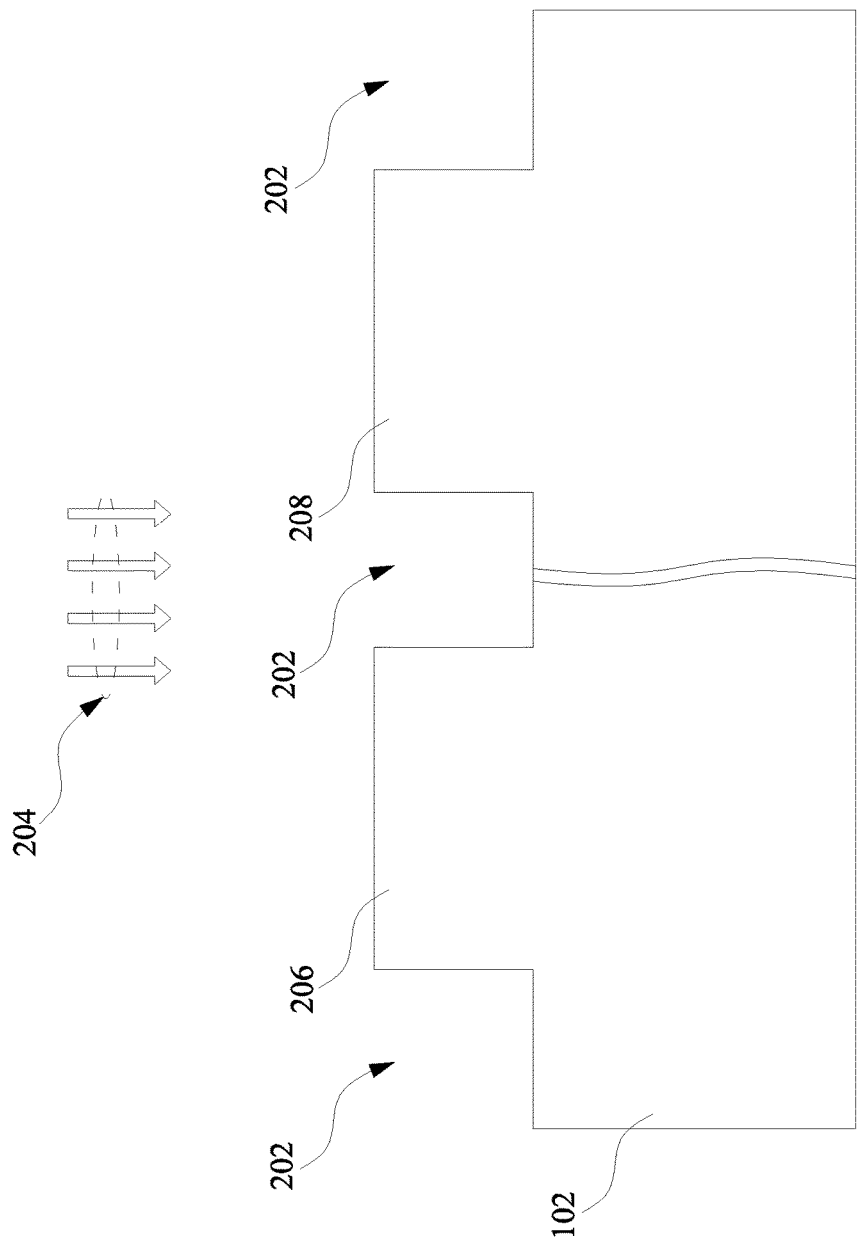

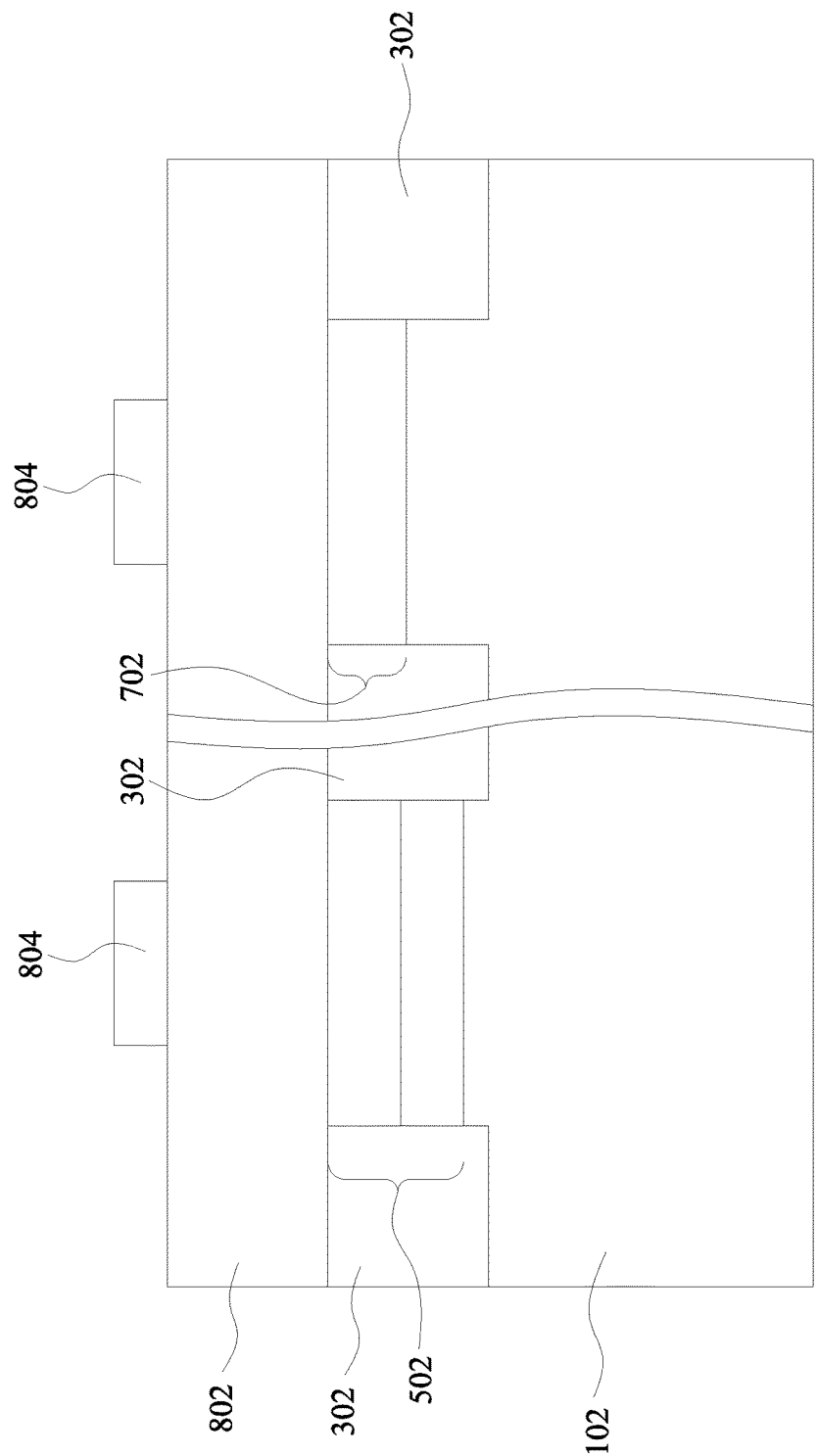

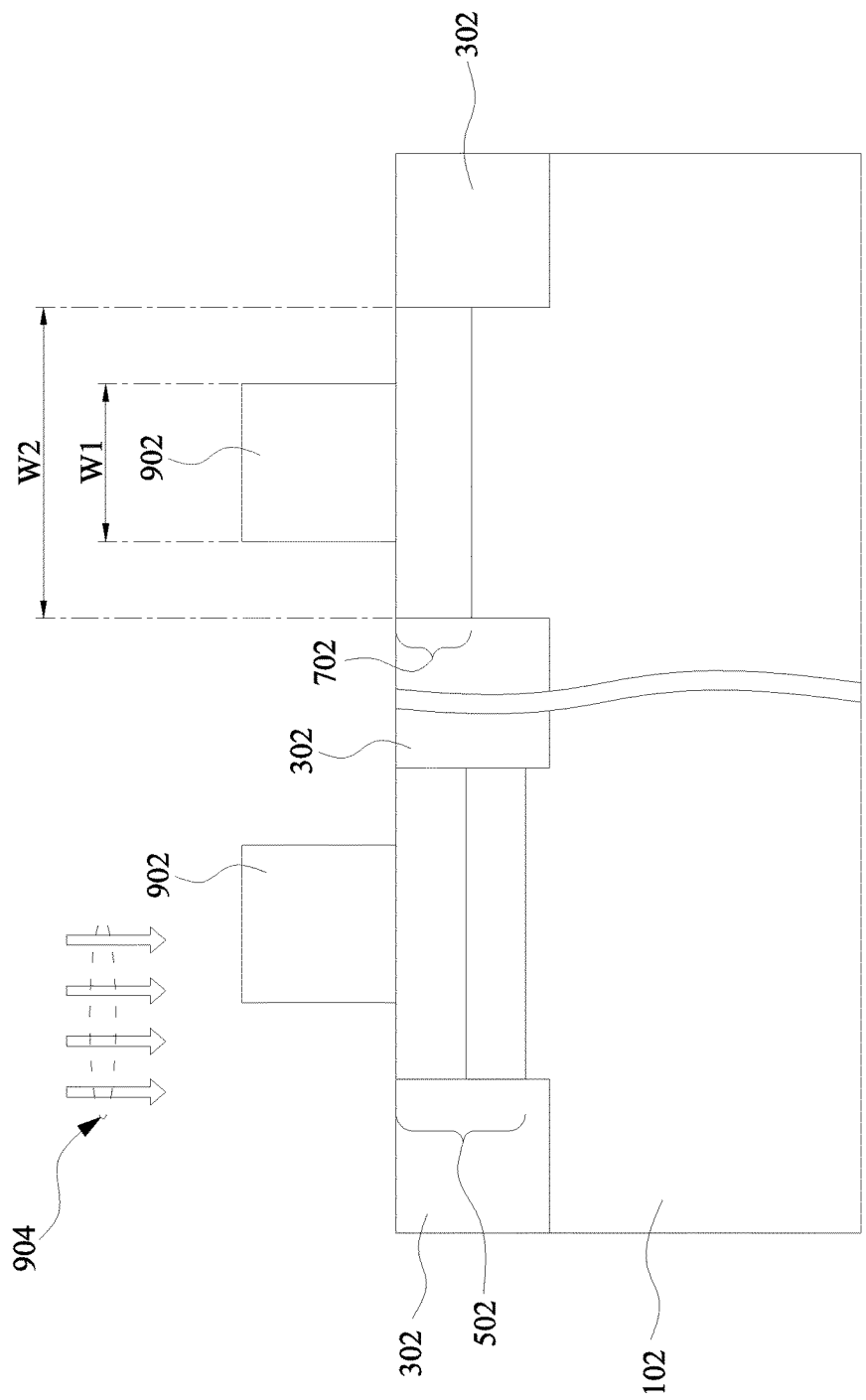

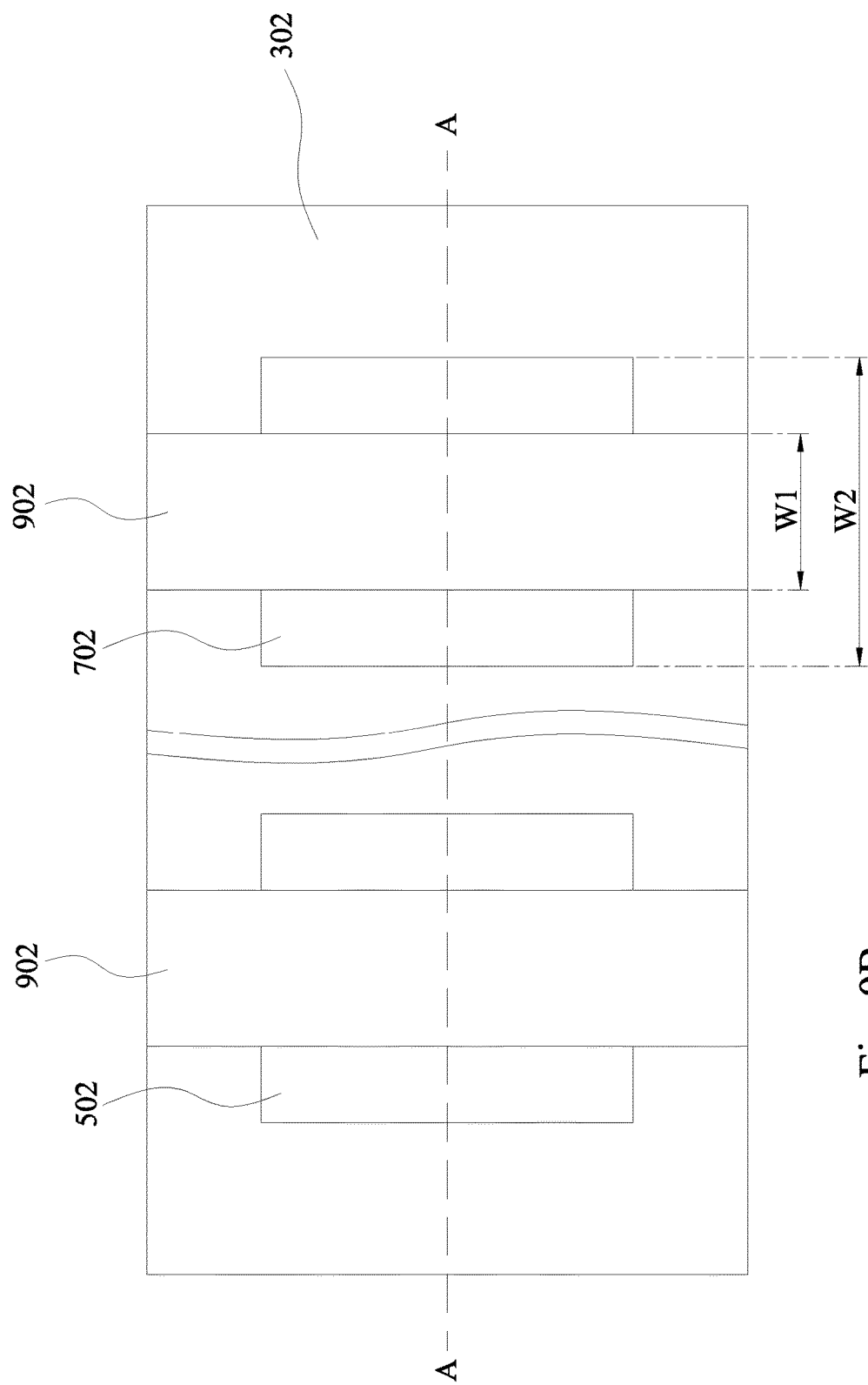

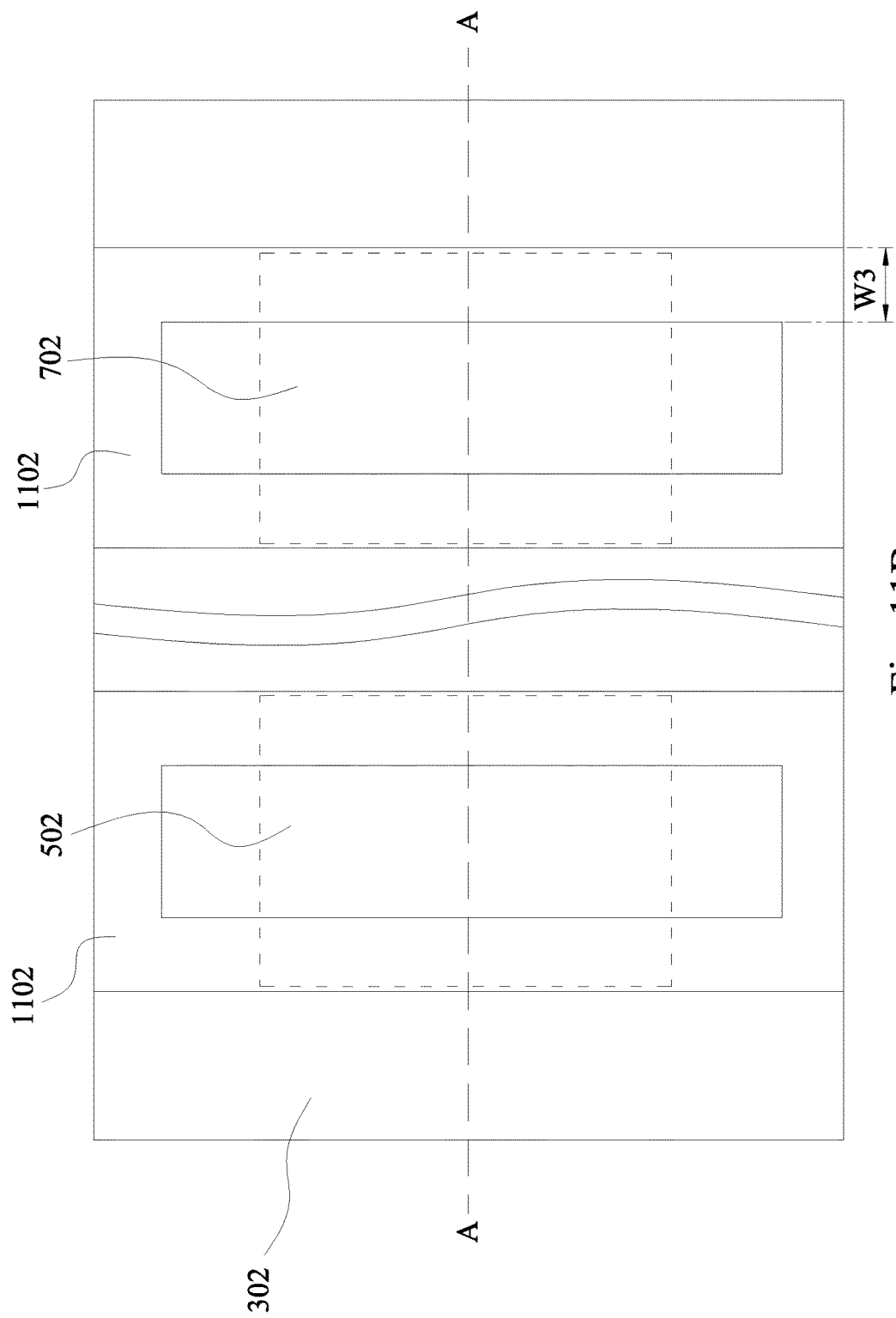

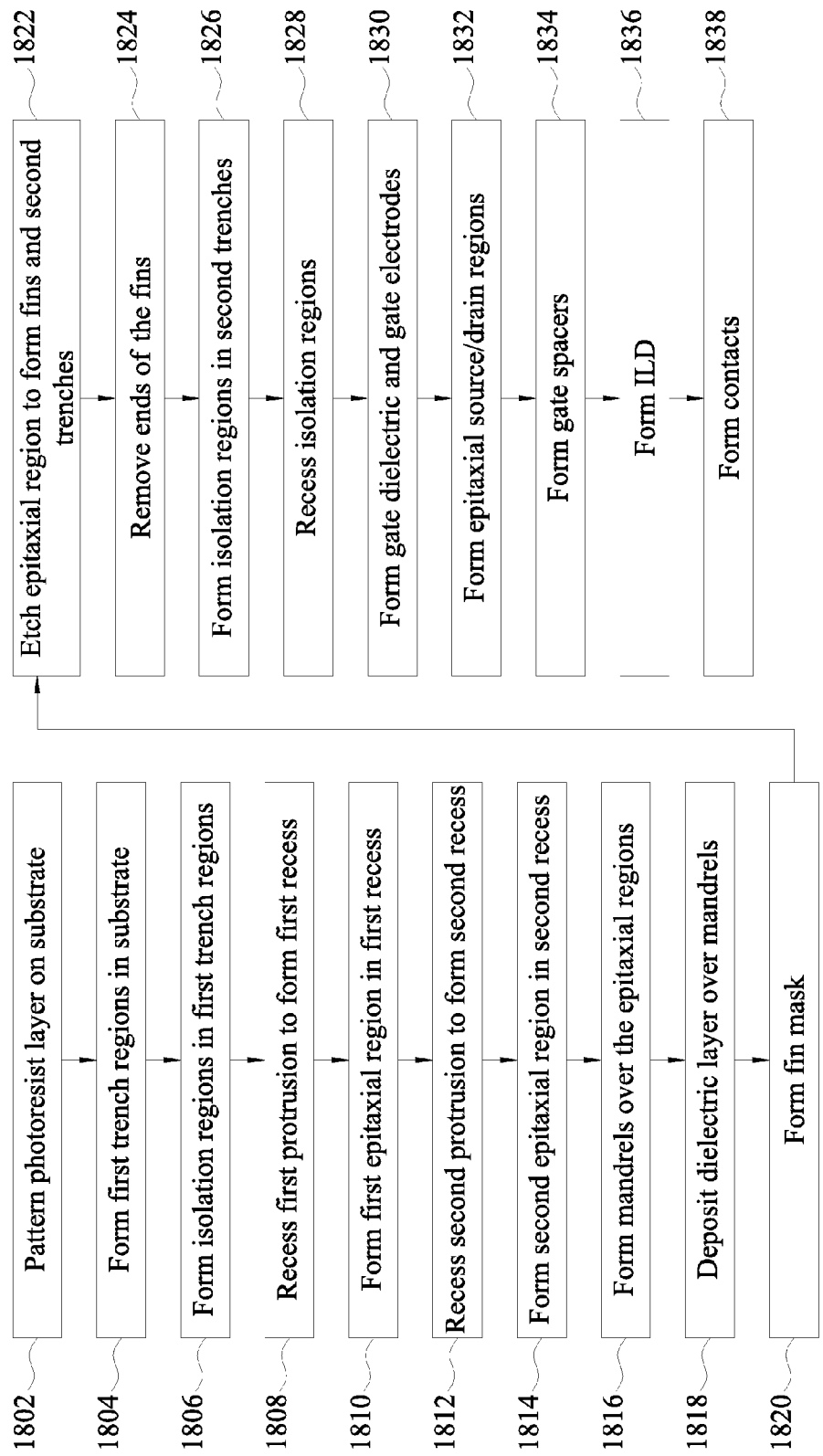

FINFET FORMATION PROCESS AND STRUCTURE

BACKGROUND

Transistors are key components of modern integrated circuits. To satisfy the requirements of increasingly faster speed, the drive currents of transistors generally need to be increasingly greater. Since the drive currents of transistors are generally proportional to gate widths of the transistors, transistors with greater gate widths are preferred.

An increase in gate widths, however, conflicts with typical requirements to reduce the sizes of semiconductor devices. Fin field-effect transistors (FinFET) were generally developed to address this problem.

FinFETs can have the advantageous feature of increased drive current without the cost of occupying more chip area. However, the typically small size of FinFET transistors can raise numerous issues during their production and manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3A, 3B, 4-8, 9A, 9B, 10, 11A, 11B, 12A, 12B, 13, 14A, 14B, and 15-17 are views of structures at various stages of fabricating a FinFET(s) in accordance with some embodiments.

FIG. 18 is a flow diagram of a method for manufacturing a FinFET device in accordance with some embodiments.

DETAILED DESCRIPTION

Figure 3A:
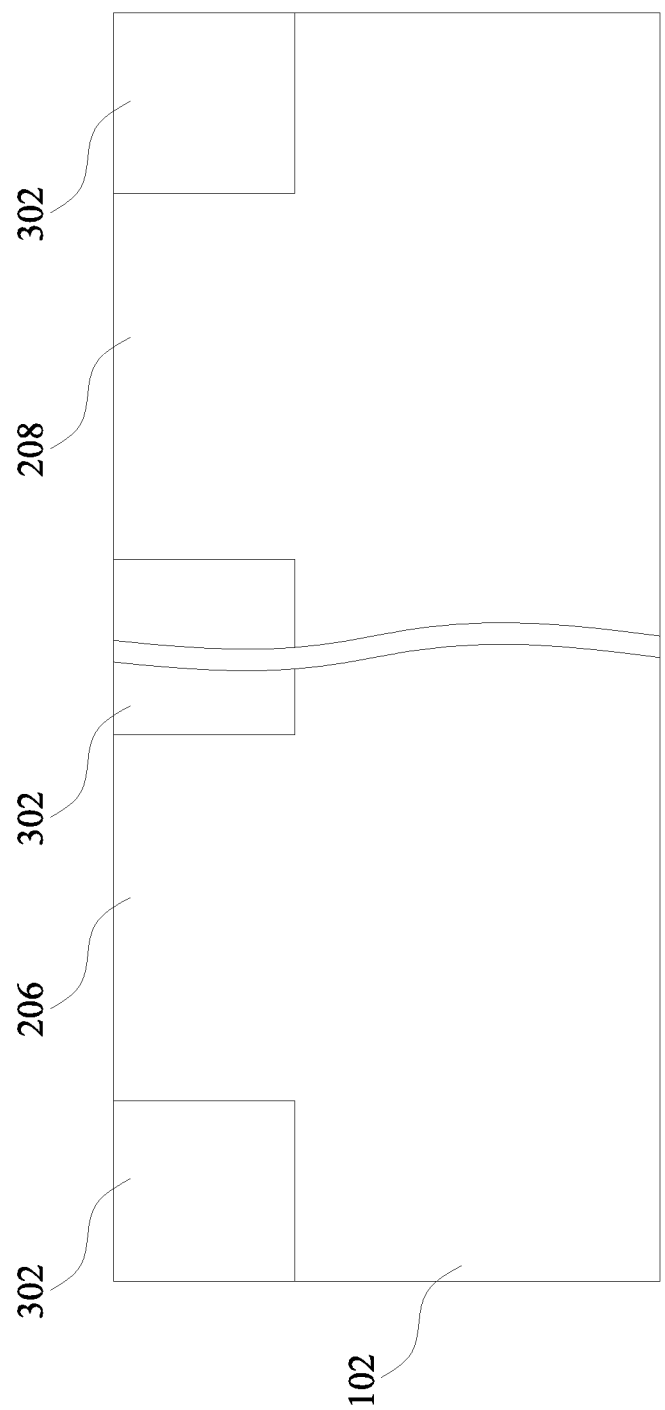

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming the FinFETs are illustrated. Some variations of the embodiments are discussed. Although method embodiments are discussed in a particular order, various other method embodiments may be performed in any logical order and may include fewer or more steps described herein.

FIGS. 1, 2, 3A, 4-8, 9A, 10, 11A, 12A, 14A, 15, and 16 are cross-sectional views of intermediate stages in the manufacturing of a FinFET in accordance with an exemplary embodiment. FIGS. 3B, 9B, 11B, 12B, 13, and 14B are top-down views of intermediate stages in the manufacturing of a FinFET. FIG. 17 is a different cross-sectional view of a FinFET after subsequent manufacturing. FIG. 18 is a process flow of the process shown in FIGS. 1 through 17.

In FIG. 1 (step 1802 of FIG. 18), a first photoresist 104 is patterned on a substrate 102. The substrate 102 may be a bulk semiconductor substrate, a semiconductor-on-insulator (SOI) substrate, or the like, which may further be a wafer. Generally, an SOI substrate comprises a layer of a semiconductor material formed on an insulator layer, such as a buried oxide (BOX), silicon oxide, or the like, on a substrate. A semiconductor material of the substrate 102 can be an elemental semiconductor, such as silicon, germanium, or the like; compound materials such as silicon germanium, silicon carbide, gallium arsenic, indium arsenide, indium phosphide, silicon germanium carbide, gallium arsenic phosphide, gallium indium phosphide, a combination of these, and the like; or the like. The substrate 102 may be doped with a p-type dopant, such as boron, aluminum, gallium, or the like, or with an n-type dopant, such as arsenic, phosphorus, or the like. In the illustrated embodiment, the substrate 102 is a bulk silicon wafer. In the illustrated embodiment, substrate 102 comprises a first region 102A and a second region 102B. The first region 102A may be an n-channel type device region, such as for an NMOS device, and the second region 102B may be a p-channel type device region, such as for a PMOS device.

In the illustrated embodiment, the first photoresist 104 is deposited and patterned over the substrate 102. The first photoresist 104 may comprise any acceptable photoresist material, and may be deposited on the surface of the substrate 102, for example, by using a spin-on process. Any suitable material and/or method of depositing the first photoresist 104 may be utilized. Once the first photoresist 104 has been deposited on the substrate 102, the first photoresist 104 may be exposed to energy, e.g. light, through a patterned reticle in order to induce a reaction in those portions of the first photoresist 104 exposed to the energy. The first photoresist 104 may then be developed, and portions of the first photoresist 104 may be removed to expose a surface of the substrate 102.

In FIG. 2 (step 1804 of FIG. 18), first trench regions 202 are formed in the substrate 102. In the illustrated example, the first trench regions 202 are formed by performing a removal process 204 to remove portions of the substrate 102 exposed by the first photoresist 104. The removal process 204 may comprise a dry etch with a plasma source and an etchant gas. The etch may be an inductively coupled plasma (ICR) etch, a transformer coupled plasma (TCP) etch, an electron cyclotron resonance (ECR) etch, a reactive ion etch (RIE), or the like. A first protrusion 206 in the first region 102A and a second protrusion 208 in the second region 102B may be formed between respective neighboring first trench regions 202. Once the first trench regions 202 have been formed, any remaining first photoresist 104 may be removed using a suitable removal process, such as a plasma ashing process.

Figure 3B:
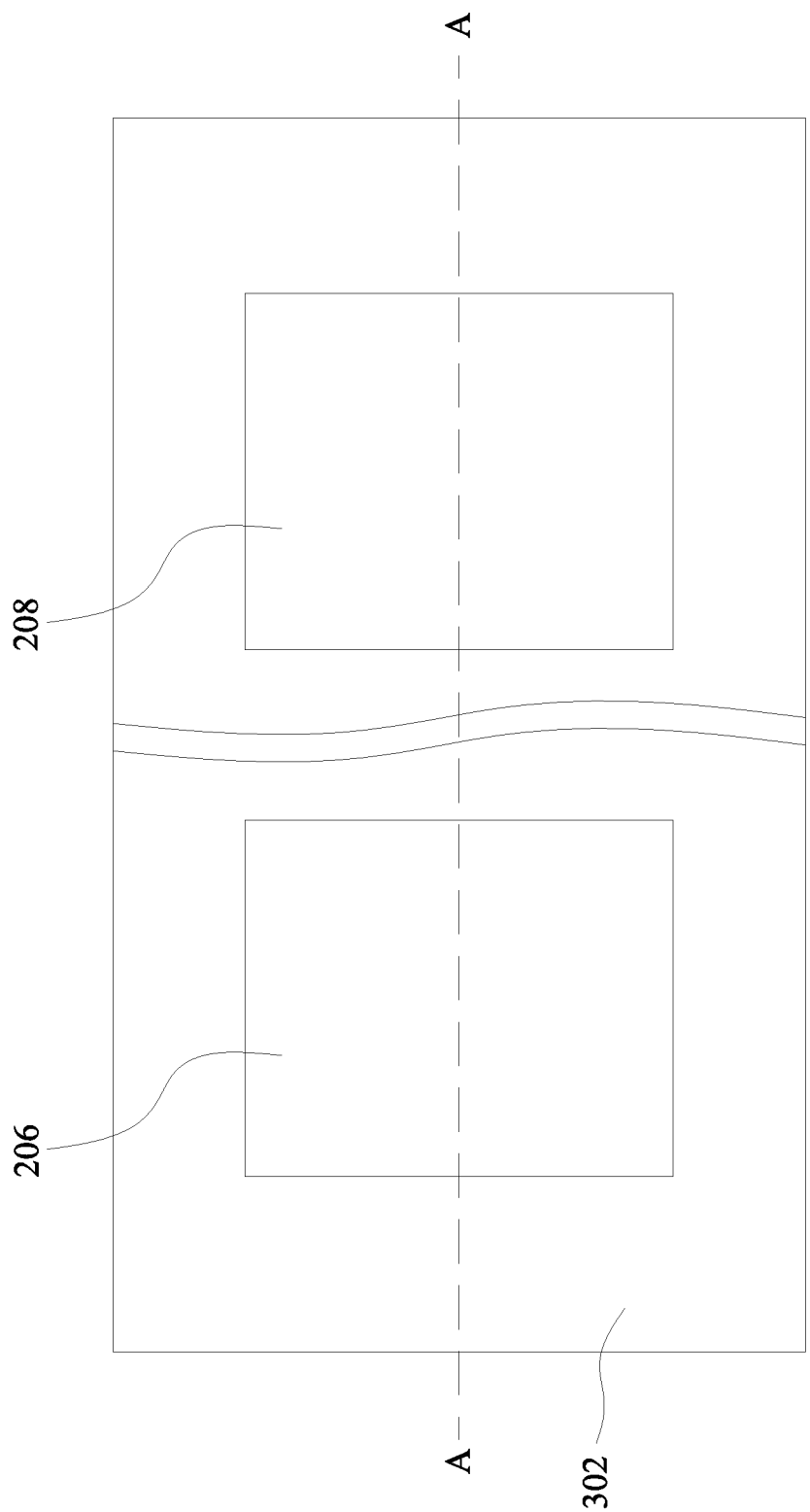

In FIGS. 3A and 3B (step 1806 of FIG. 18), an insulation material is formed in the first trench regions 202 to form first isolation regions 302. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

A planarization process may be used to remove any excess insulation material. The planarization process may be, e.g., a chemical-mechanical polish (CMP) or any other suitable process. This removal may form top surfaces of the first isolation regions 302, the first protrusion 206, and the second protrusion 208 that are co-planar. FIG. 3B shows a layout view of the structure in FIG. 3A, illustrating the planarized surfaces. The cross-sectional view of the structure shown in FIG. 3A is viewed along line A-A of FIG. 3B.

Figure 4:
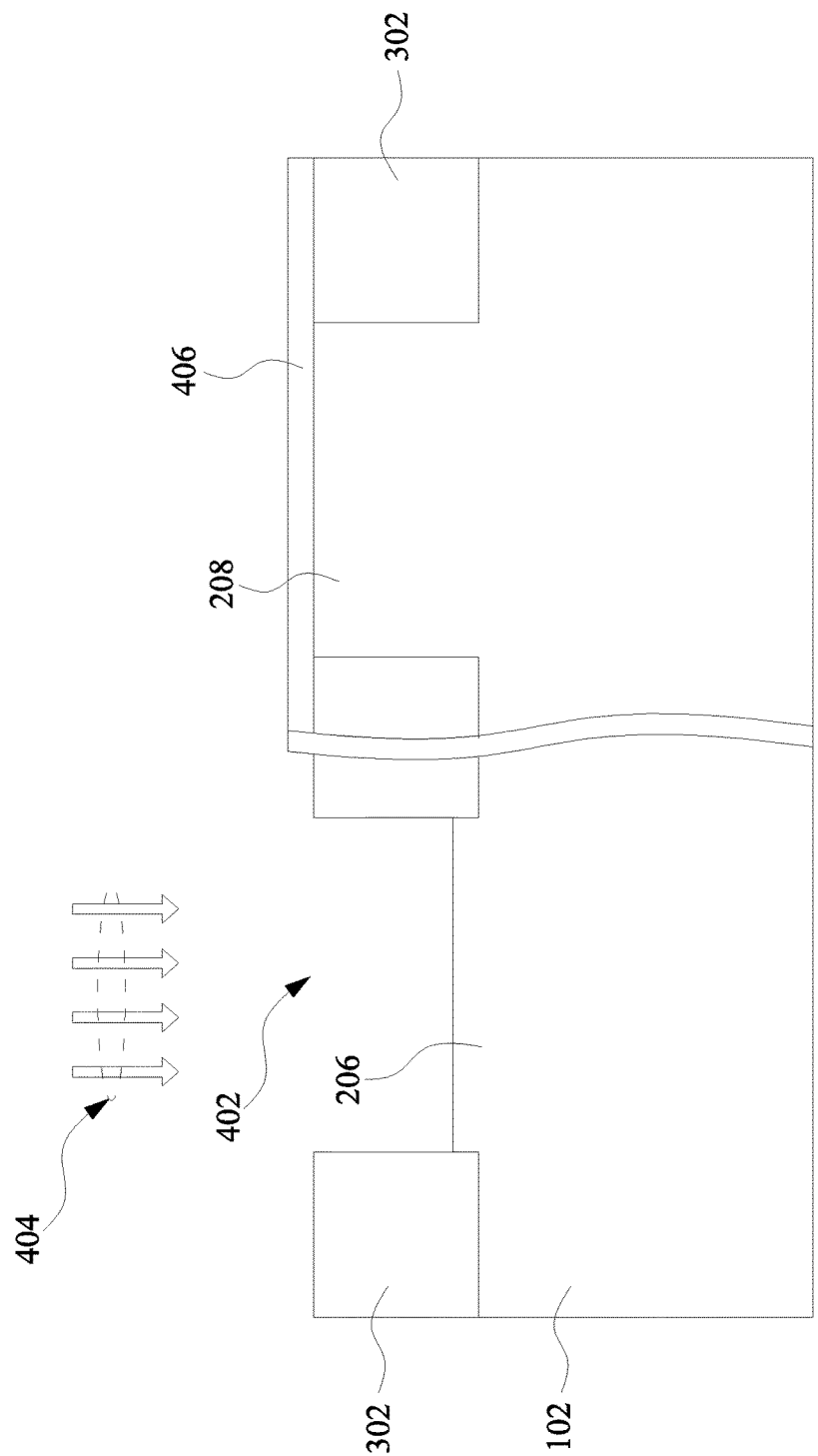

In FIG. 4 (step 1808 of FIG. 18), a first recess 402 is formed by recessing the first protrusion 206. A first mask 406 may be patterned over the second region 102B of the substrate 102, and then the first protrusion 206 may be recessed by a removal process 404. The first mask 406 may be a hardmask material such as silicon nitride, silicon carbon nitride, the like, or a combination thereof, and may be deposited using any acceptable process, such as CVD, plasma enhanced chemical vapor deposition (PECVD), or the like. A photoresist layer may then be formed over the second region 102B, and a removal process may remove the exposed portions of the hardmask material from over the first region 102A.

After patterning the first mask 406, the first protrusion 206 is exposed. The first protrusion 206 may then be recessed by the removal process 404. The removal process 404 may comprise any acceptable etch process, such as a RIE, NBE, tetramethylammonium hydroxide (TMAH), ammonium hydroxide (NH$_4$OH), a wet etchant capable of etching silicon with good etch selectivity between silicon and a material of the first isolation regions 302, the like, or a combination thereof. The etch may be isotropic.

Figure 5:
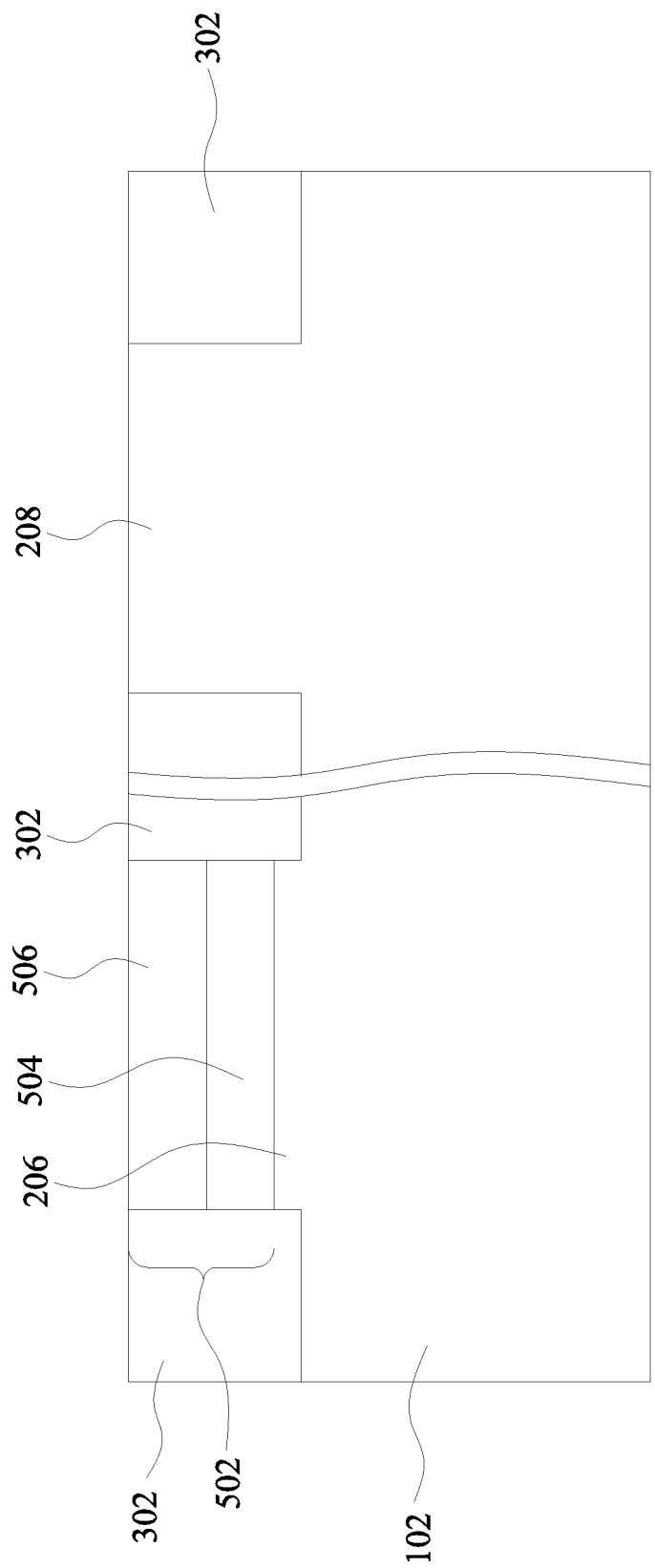

In FIG. 5 (step 1810 of FIG. 18), a first epitaxial region 502 may be formed in the first recess 402. In the illustrated embodiment, the first epitaxial region 502 comprises a first crystalline layer 504 on the remaining portion of the first protrusion 206, and a second crystalline layer 506 on the first crystalline layer 504. The first crystalline layer 504 and the second crystalline layer 506 may be formed, e.g., by epitaxially growing the first crystalline layer 504 and second crystalline layer 506 in the first recess 402. In various embodiments, materials of the first crystalline layer 504 and the second crystalline layer 506 can include silicon, germanium, silicon germanium, silicon carbide, a III-V compound semiconductor, a II-VI compound semiconductor, or the like. For example, III-V semiconductors include InAs, AlAs, GaAs, InP, GaN, InGaAs, InAlAs, GaSb, AlSb, AlP, GaP, and the like. The first crystalline layer 504 and the second crystalline layer 506 can be formed using metal-organic CVD (MOCVD), molecular beam epitaxy (MBE), liquid phase epitaxy (LPE), vapor phase epitaxy (VPE), selective epitaxial growth (SEG), the like, or a combination thereof.

The second crystalline layer 506 may be strained, which may increase carrier mobility in a subsequently formed device. In the illustrated embodiment, an n-channel type device may be formed in the first region 102A, and thus, a tensile strain can be induced in the second crystalline layer 506. The strain can be induced in the second crystalline layer 506 by, e.g., a mismatch of crystalline lattices between the second crystalline layer 506 and the adjoining underlying material, which is the first crystalline layer 504 in the illustrated embodiment. The first crystalline layer 504 may function as a buffer layer and may undergo plastic and/or elastic relaxation. In the illustrated embodiment, the first crystalline layer 504 is SiGe, and the second crystalline layer 506 is Si, which may be tensilely strained.

In some embodiments, a planarization process, such as a CMP, may then be performed in order to planarize tops of the first epitaxial region 502 and the first isolation regions 302. The planarization process may also remove the first mask 406.

Figure 6:
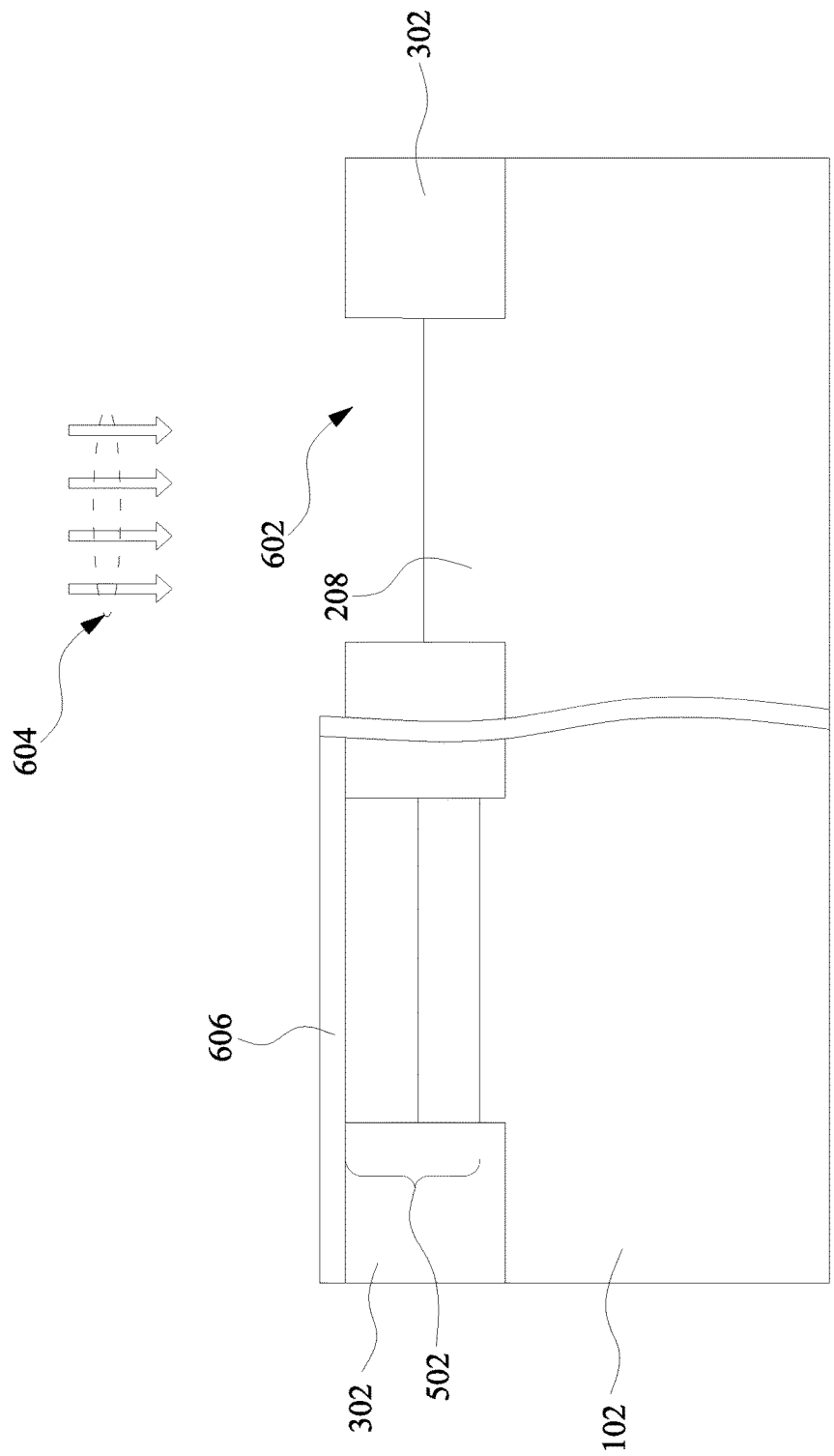

In FIG. 6 (step 1812 of FIG. 18), a second recess 602 is formed by recessing the second protrusion 208. A second mask 606 may be patterned over the first region 102A of the substrate 102, and then the second protrusion 208 may be recessed by a removal process 604. The second mask 606 may be a hardmask material such as silicon nitride, silicon carbon nitride, the like, or a combination thereof, and may be deposited using any acceptable process, such as CVD, PECVD, or the like. A photoresist layer may then be formed over the first region 102A, and a removal process may remove the exposed portions of the hardmask material from over the second region 102B.

After patterning the second mask 606, the second protrusion 208 is exposed. The second protrusion 208 may then be recessed by the removal process 604. The removal process 604 may comprise any acceptable etch process, such as a RIE, NBE, tetramethylammonium hydroxide (TMAH), ammonium hydroxide (NH$_4$OH), a wet etchant capable of etching silicon with good etch selectivity between silicon and a material of the first isolation regions 302, the like, or a combination thereof. The etch may be isotropic.

Figure 7:
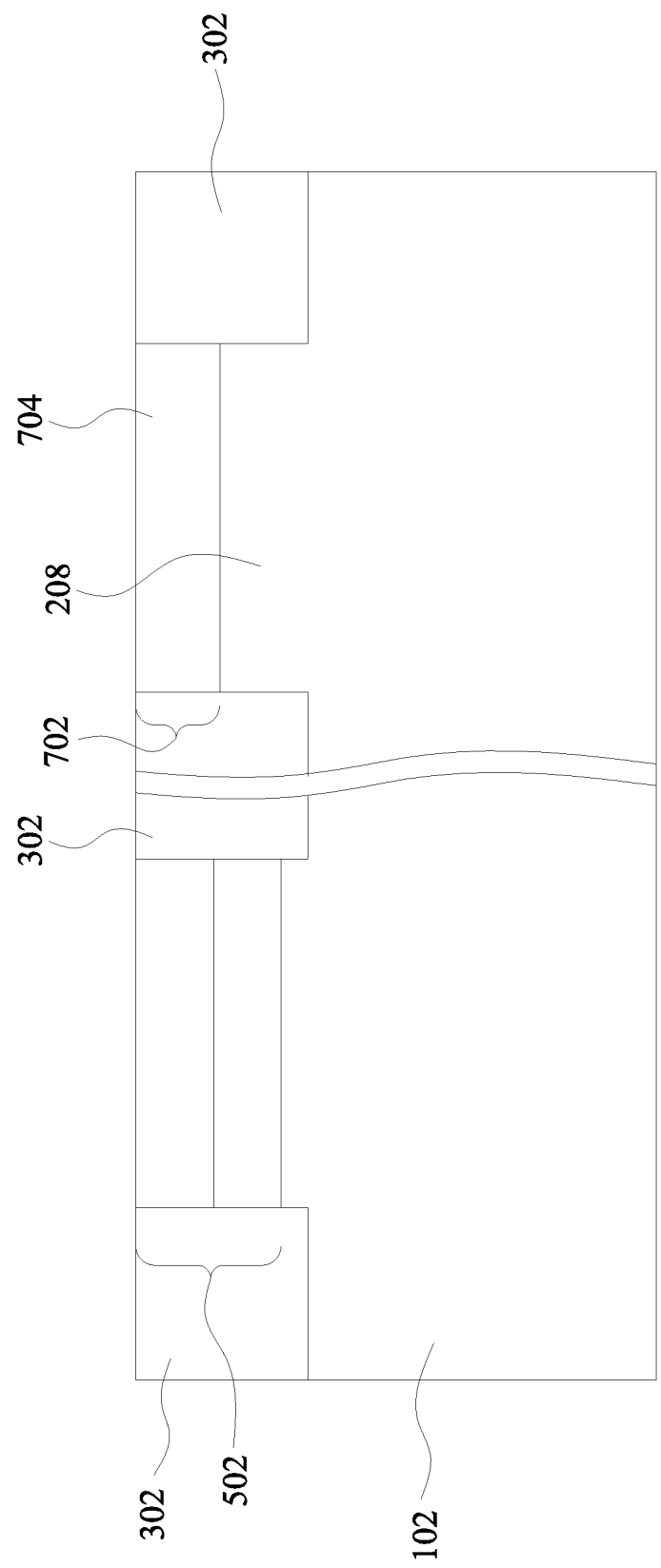

In FIG. 7 (step 1814 of FIG. 18), a second epitaxial region 702 may be formed in the second recess 602. In the illustrated embodiment, the second epitaxial region 702 comprises a third crystalline layer 704 on the remaining portion of the second protrusion 208. The third crystalline layer 704 may be formed, e.g., by epitaxially growing it in the second recess 602. In various embodiments, materials of the third crystalline layer 704 include silicon, germanium, silicon germanium, silicon carbide, a III-V compound semiconductor, a II-VI compound semiconductor, or the like. For example, III-V semiconductors include InAs, AlAs, GaAs, InP, GaN, InGaAs, InAlAs, GaSb, AlSb, AlP, GaP, and the like. The third crystalline layer 704 can be formed using metal-organic CVD (MOCVD), molecular beam epitaxy (MBE), liquid phase epitaxy (LPE), vapor phase epitaxy (VPE), selective epitaxial growth (SEG), the like, or a combination thereof.

The third crystalline layer 704 may be strained, which may increase carrier mobility in a subsequently formed device. In the illustrated embodiment, a p-channel type device may be formed in the second region 102B, and thus, a compressive strain can be induced in the third crystalline layer 704. The strain can be induced in the third crystalline layer 704 by, e.g., a mismatch of crystalline lattices between the third crystalline layer 704 and the adjoining underlying material, which is the second protrusion 208 in the illustrated embodiment. In the illustrated embodiment, the third crystalline layer 704 is SiGe, which may be compressively strained.

In some embodiments, a planarization process, such as a CMP, may then be performed in order to planarize tops of the second epitaxial region 702 and the first isolation regions 302. The planarization process may also remove the second mask 606.

In FIG. 8 (step 1816 of FIG. 18), a mandrel layer 802 is formed over the first region 102A and the second region 102B of the substrate 102. The mandrel layer 802 may cover the first isolation regions 302, the first epitaxial region 502, and the second epitaxial region 702. The mandrel layer 802 may be a material such as polysilicon, silicon nitride, silicon oxide, the like, or a combination thereof, and may be formed using a process such as a CVD, PECVD, or the like.

After formation of the mandrel layer 802, a second photoresist 804 may be deposited and patterned over the mandrel layer 802. The second photoresist 804 may comprise any acceptable photoresist material, and may be deposited on the surface of the mandrel layer 802, for example, by using a spin-on process. Any suitable material and/or method of depositing the second photoresist 804 may be utilized. Once the second photoresist 804 has been deposited on the mandrel layer 802, the second photoresist 804 may be exposed to energy, e.g. light, through a patterned reticle in order to induce a reaction in those portions of the second photoresist 804 exposed to the energy. The second photoresist 804 may then be developed, and portions of the second photoresist 804 may be removed to expose a surface of the mandrel layer 802. In some embodiments, the widths of respective patterns of the second photoresist 804 are less than the widths of the first epitaxial region 502 and the second epitaxial region 702.

In FIGS. 9A and 9B (continuing step 1816 of FIG. 18), mandrels 902 are formed over the first epitaxial region 502 and the second epitaxial region 702 by a removal process 904 (indicated by the arrows in FIG. 9A). In some embodiments, the removal process 904 may etch into the mandrel layer 802 and form the mandrels 902. The removal process 904 may remove all of the portions of the mandrel layer 802 exposed by the second photoresist 804. In some embodiments, the removal process 904 may be an acceptable anisotropic etch process, e.g., a RIE, TCP, or the like. Remaining portions of the mandrel layer 802 form the mandrels 902.

FIG. 9B shows a layout view of the structure in FIG. 9A, illustrating the mandrels 902. The cross-sectional view of the structure shown in FIG. 9A is viewed along line A-A of FIG. 9B. In the illustrated embodiment, the mandrels 902 are over the first epitaxial region 502 and the second epitaxial region 702. As illustrated in FIG. 9B, the mandrels 902 may extend over the first isolation regions 302. The mandrels 902 do not completely cover the first epitaxial region 502 or the second epitaxial region 702, and portions of the epitaxial regions may remain exposed on a side(s) of each mandrel 902. For example, the mandrels 902 may have a first width $w_1$ that is less than a second width $w_2$ of the second epitaxial region 702. The difference $\Delta$ between the second width $w_2$ and the first width $w_1$ may be between about 7 nm and about 15 nm. A width of each laterally exposed portion of the first epitaxial region 502 and the second epitaxial region 702 (e.g., widths in the plane of the cross sectional view of FIG. 9A) may be half of the difference $\Delta$.

Figure 10:
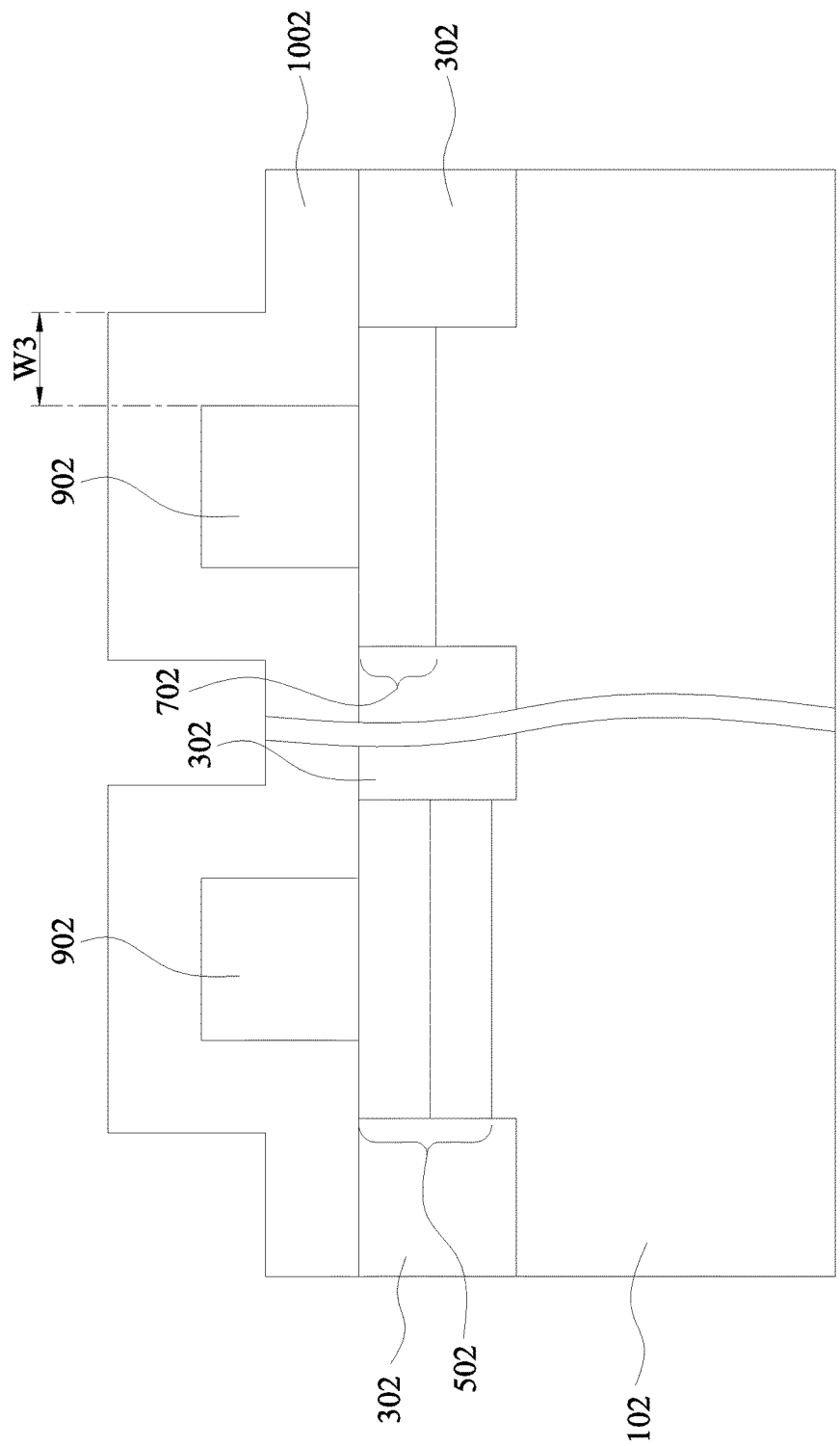

In FIG. 10 (step 1818 of FIG. 18), a dielectric layer 1002 is conformally formed over the mandrels 902. In some embodiments, the dielectric layer 1002 covers the top surfaces and sidewalls of the mandrels 902. The dielectric layer 1002 may be one or more suitable dielectric materials such as silicon oxide, silicon nitride, silicon carbon nitride, silicon oxide nitride, a combination of these, or the like. The dielectric layer 1002 may be deposited using any suitable process such as atomic layer deposition (ALD), CVD, or the like. The vertical segments of the dielectric layer 1002 may be a third width $w_3$ between about 7 nm and about 15 nm. In some embodiments, the vertical segments of the dielectric layer 1002 may extend over the first isolation region 302. The third width $w_3$ may be greater than half of the difference $\Delta$ discussed in FIGS. 9A and 9B.

Figure 11A:
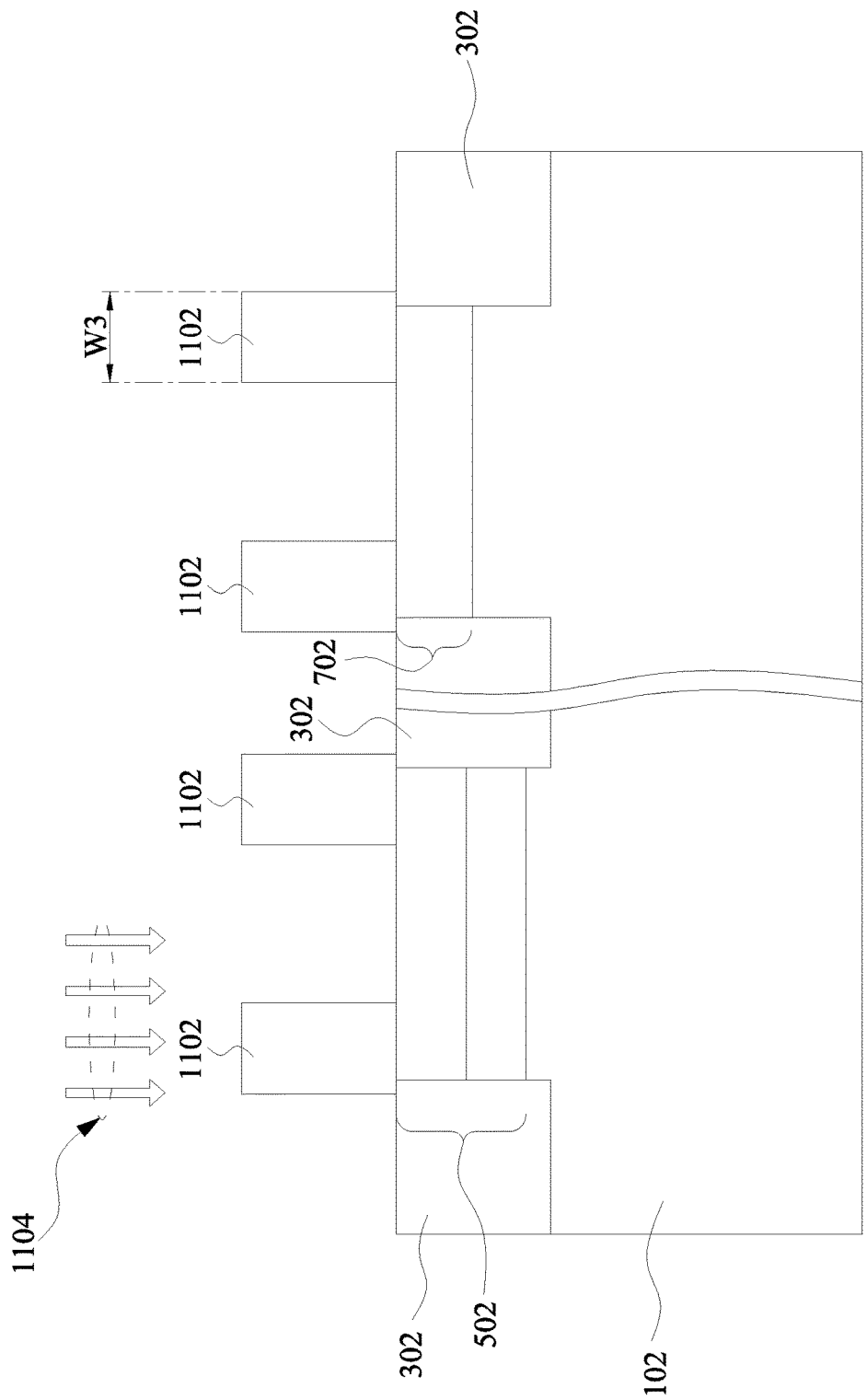

In FIGS. 11A and 11B (step 1820 of FIG. 18), fin masks 1102 are formed by removing horizontal portions of the dielectric layer 1002 and the mandrels 902. The horizontal portions of the dielectric layer 1002 may be removed using a removal process 1104, such as an acceptable anisotropic etch process, e.g., a RIE, TCP, or the like. The vertical portions of the dielectric layer 1002 remain, forming the fin masks 1102 having a width roughly equal to that of the vertical portions of the dielectric layer 1002, e.g., third width $w_3$. Subsequently, the mandrels 902 may be removed using an etch selective to the material of the mandrels 902.

FIG. 11B shows a layout view of the structure in FIG. 11A, illustrating the fin masks 1102. The cross-sectional view of the structure shown in FIG. 11A is viewed along the A-A line of FIG. 11B. In the illustrated embodiment, the fin masks 1102 cover portions of the first epitaxial region 502, the second epitaxial region 702, and the first isolation regions 302.

In some embodiments, the fin masks 1102 may form a pattern that partially covers the first epitaxial region 502 and/or the second epitaxial region 702. In some embodiments, more than one of the fin masks 1102 are formed over the first epitaxial region 502 and/or the second epitaxial region 702. In some embodiments, an edge of the epitaxial regions 502 and 702 may be substantially aligned with respective sidewalls of the fin masks 1102. The fin masks 1102 may act as a mask over the first epitaxial region 502 and/or the second epitaxial region 702 during subsequent etching.

Figure 12A:
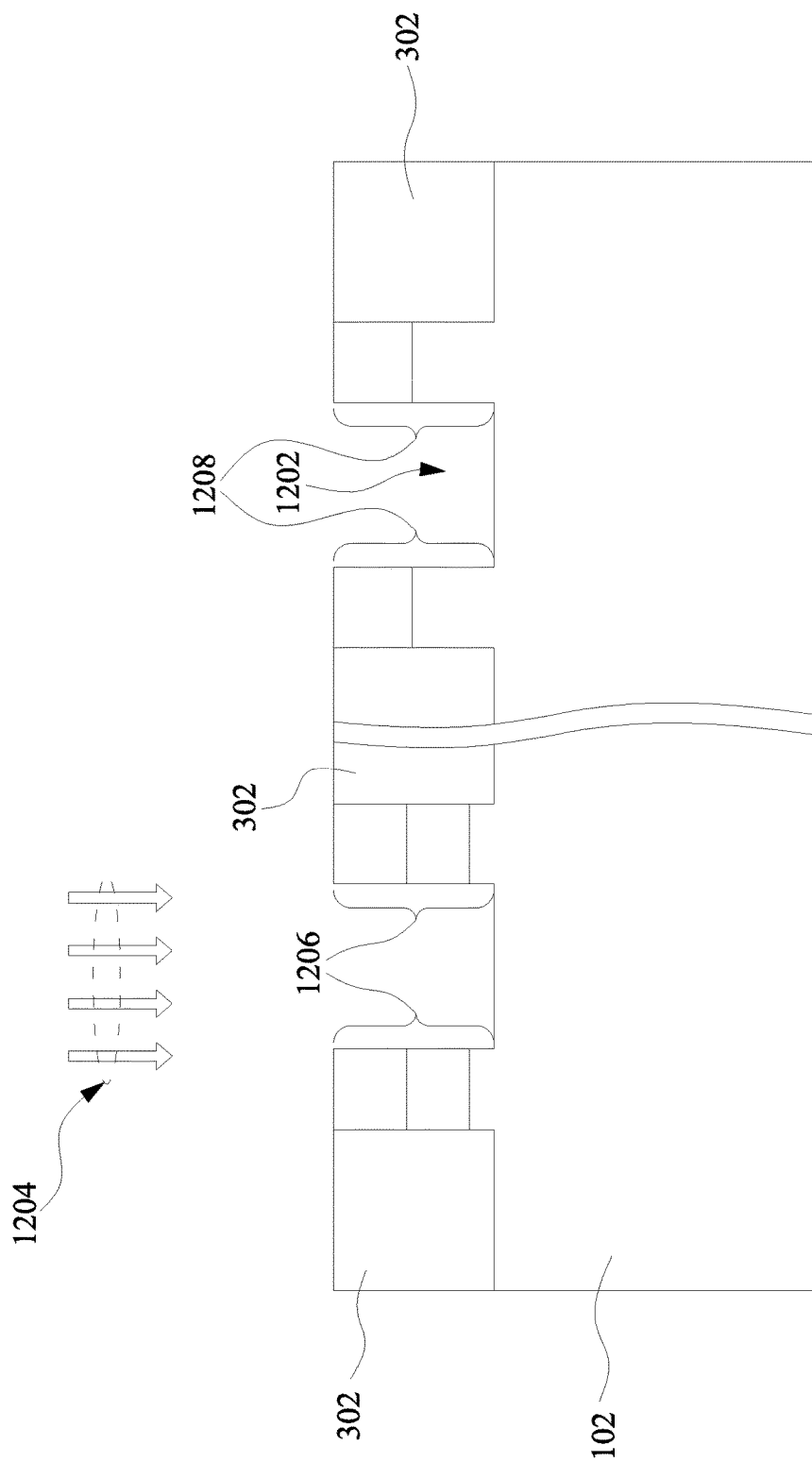
Figure 12B:
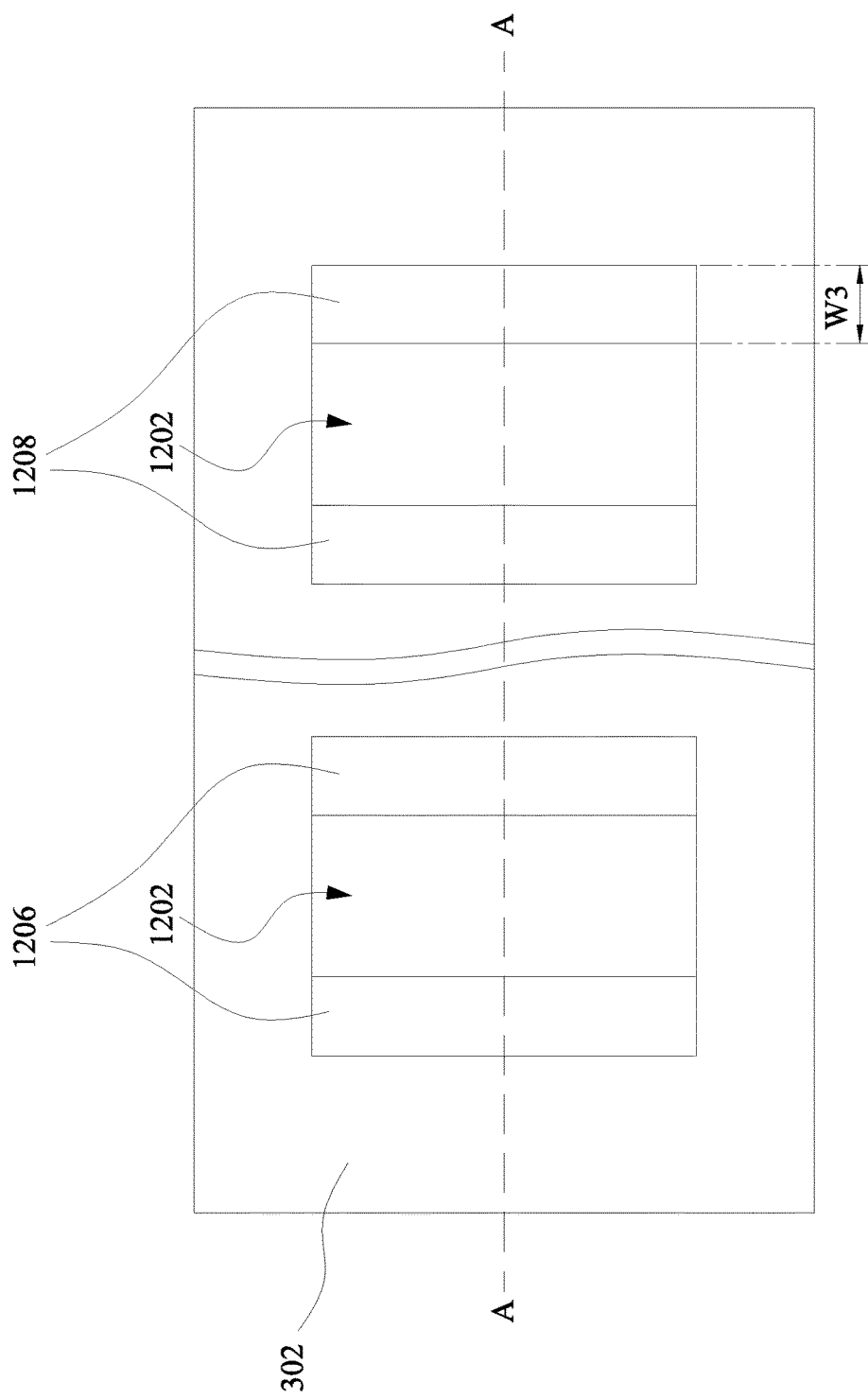

In FIGS. 12A and 12B (step 1822 of FIG. 18), second trench regions 1202 are formed. The second trench regions 1202 may be formed by a removal process 1204. The removal process 1204 may comprise any anisotropic etch process, such as a RIE, NBE, TMAH, NH$_4$OH, the like, or a combination thereof.

Forming the second trench regions 1202 also results in the formation of first fins 1206 and second fins 1208. In some embodiments, the removal process 1204 etches into the first epitaxial region 502 and/or the second epitaxial region 702 in order to remove the portions exposed by the fin masks 1102. Thus, in some embodiments, the first fins 1206 and the second fins 1208 may each have a width substantially equal to that of the fin masks 1102, e.g., third width $w_3$. In some embodiments, the width of the first fins 1206 and the second fins 1208 may be less than the third width $w_3$, due to the fin masks 1102 being partially over the first isolation regions 302. Any remaining fin masks 1102 may be removed after the removal process 1204.

FIG. 12B shows a layout view of the structure in FIG. 12A, illustrating the second trench regions 1202. The cross-sectional view of the structure shown in FIG. 12A is viewed along the A-A line of FIG. 12B.

Figure 13:
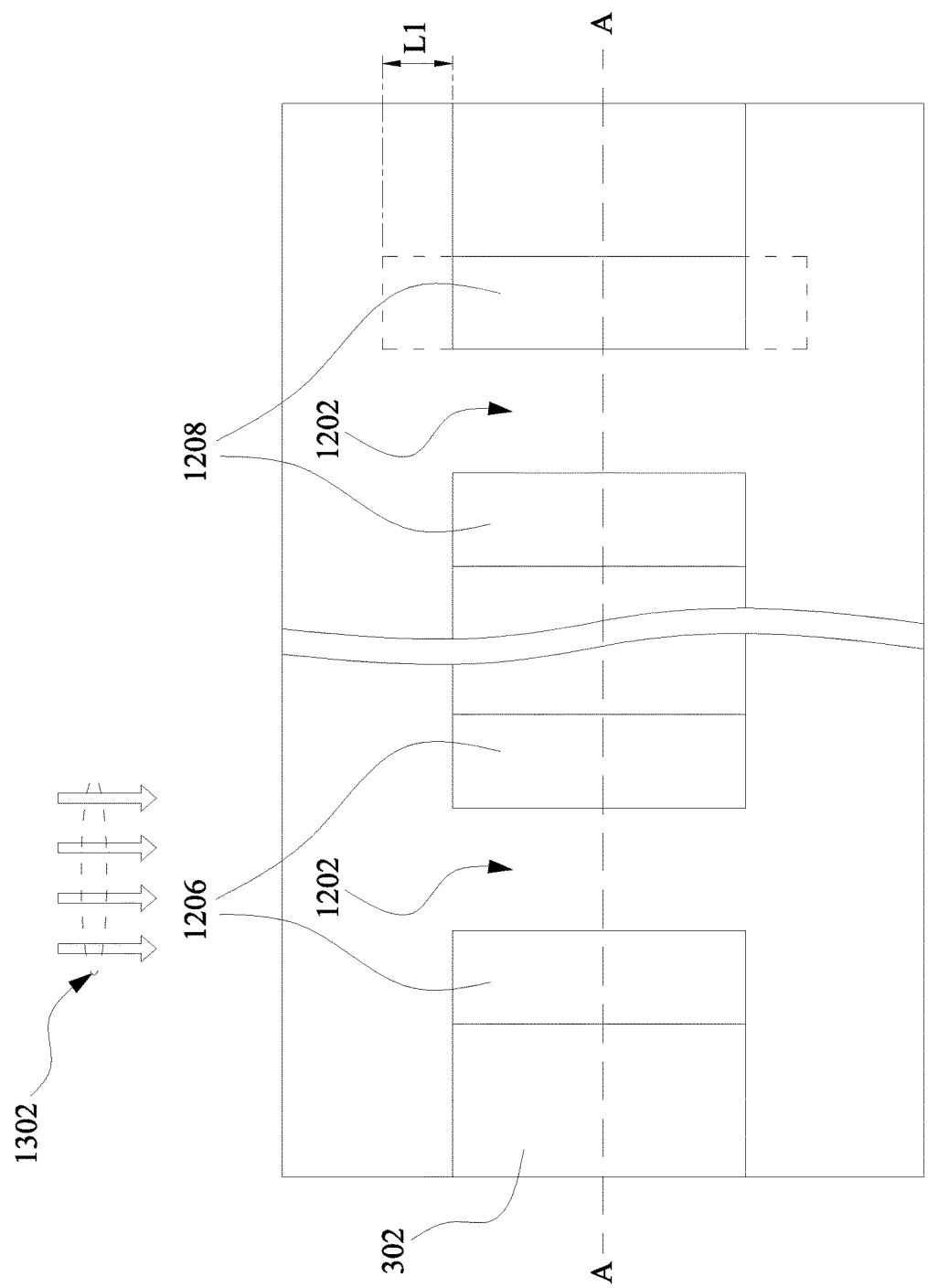

FIG. 13 shows a layout view of the structure after an end-cut process. In FIG. 13 (step 1824 of FIG. 18), the ends of the first fins 1206 and the second fins 1208, and possibly some portions of the first isolation regions 302, are removed by an end cut process 1302. The end cut process 1302 may remove from each end of the fin a portion of the fin having a length $L_1$ between tens of nm to several µm, such as between about 10 nm and about 1 µm. In some embodiments, the edges of epitaxially grown structures may contain defects, such as stacking faults. The end cut process 1302 may remove those defects from the end of the first fins 1206 and the second fins 1208. The end cut process 1302 may use an acceptable photolithography and removal process. A photoresist layer may be formed on the first isolation regions 302 and the top surfaces of the fins 1206 and 1208, and a removal process may then remove the exposed ends of the fins 1206 and 1208 and exposed portions of the first isolation regions 302, as illustrated. The removal process may comprise an acceptable isotropic etch, e.g., a RIE, TCP, or the like. After the removal process, the remaining photoresist layer may then be removed.

Figure 14A:
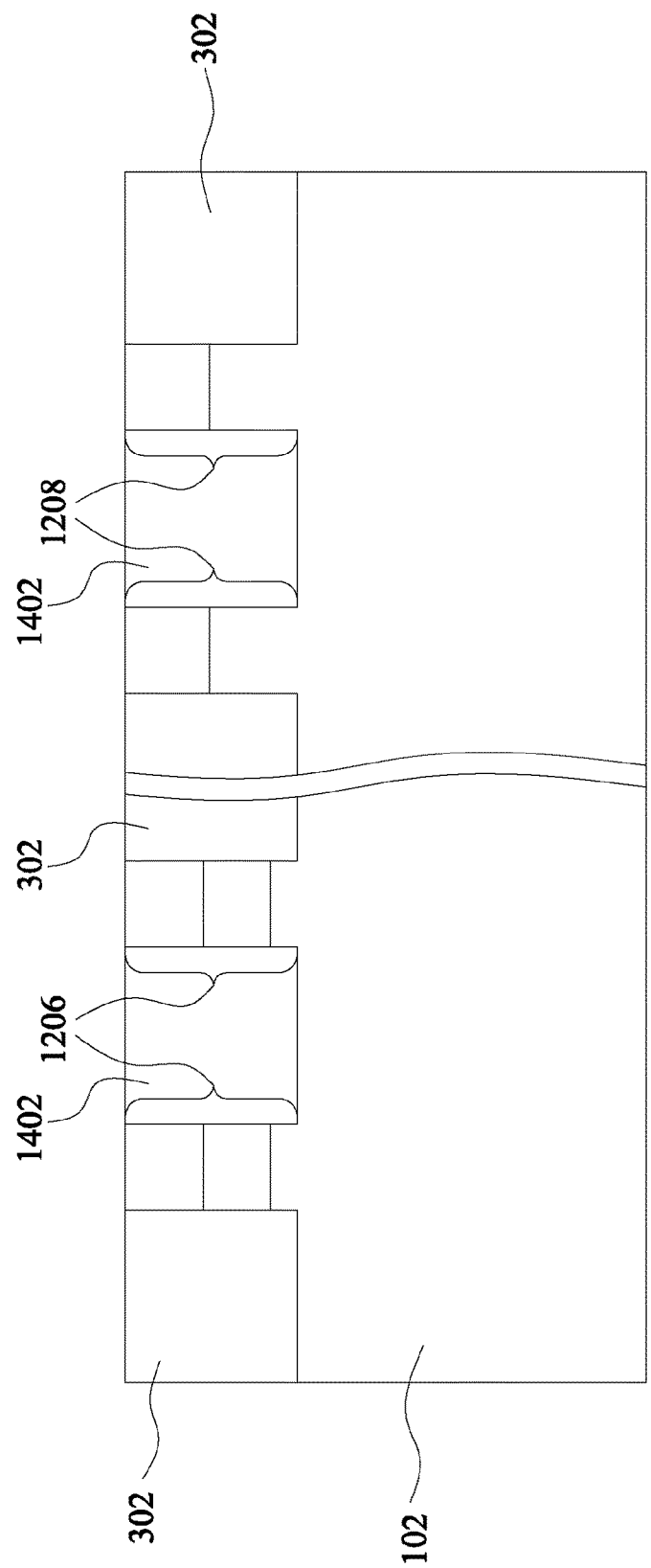
Figure 14B:
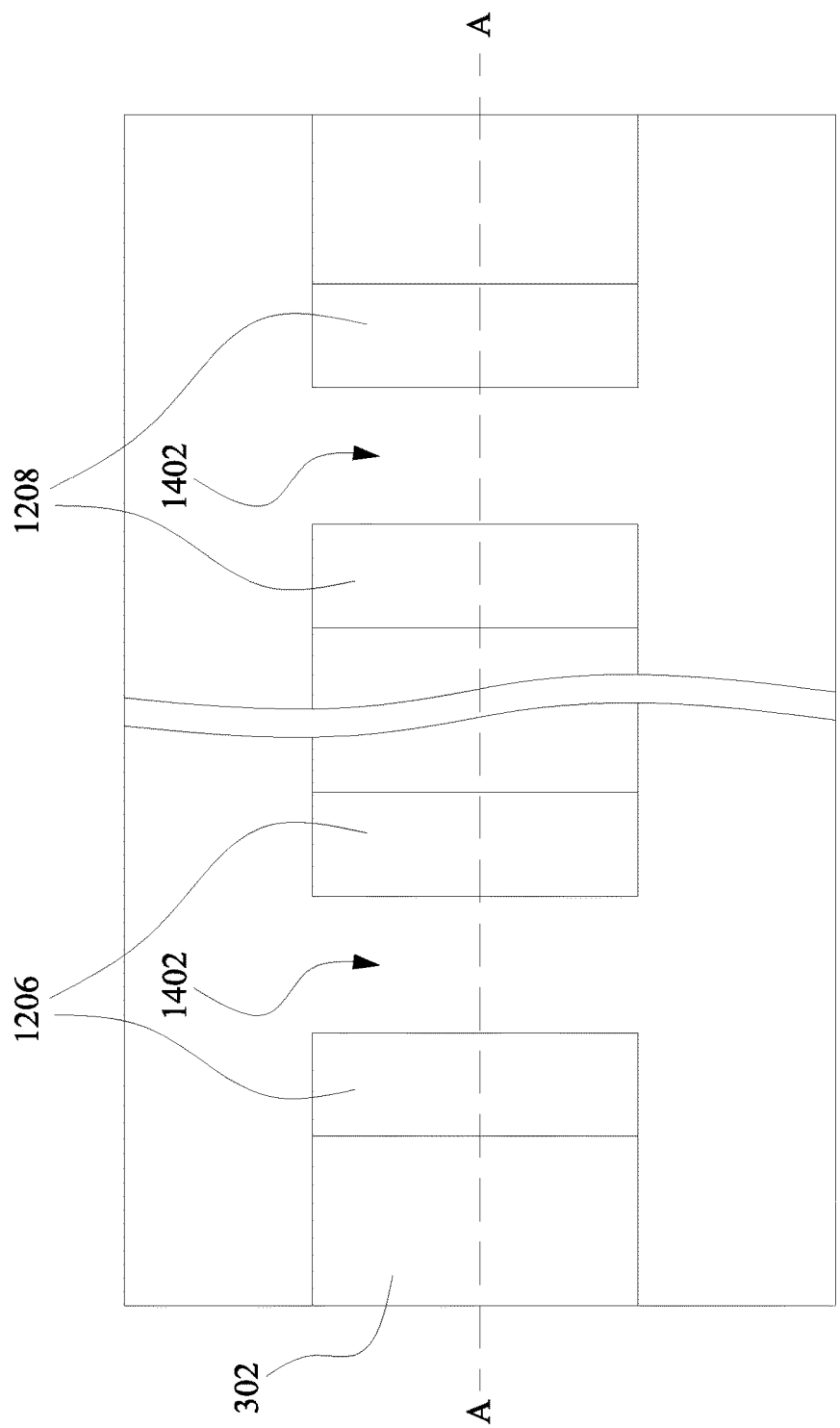

In FIGS. 14A and 14B (step 1826 of FIG. 18), an insulation material is formed in the second trench regions 1202 and other areas where the first isolation regions 302 were removed in FIG. 13 to form second isolation regions 1402. The insulation material may be an oxide, such as silicon oxide, a nitride, the like, or a combination thereof, and may be formed by a low temperature process, such as a plasma-enhanced atomic layer deposition (PEALD) or the like. Other insulation materials formed by any acceptable process may be used. A planarization process, such as a CMP, may then be performed to planarize the top surface of the second isolation regions 1402 with the tops of the first fins 1206, the second fins 1208, and the first isolation regions 302.

Figure 15:
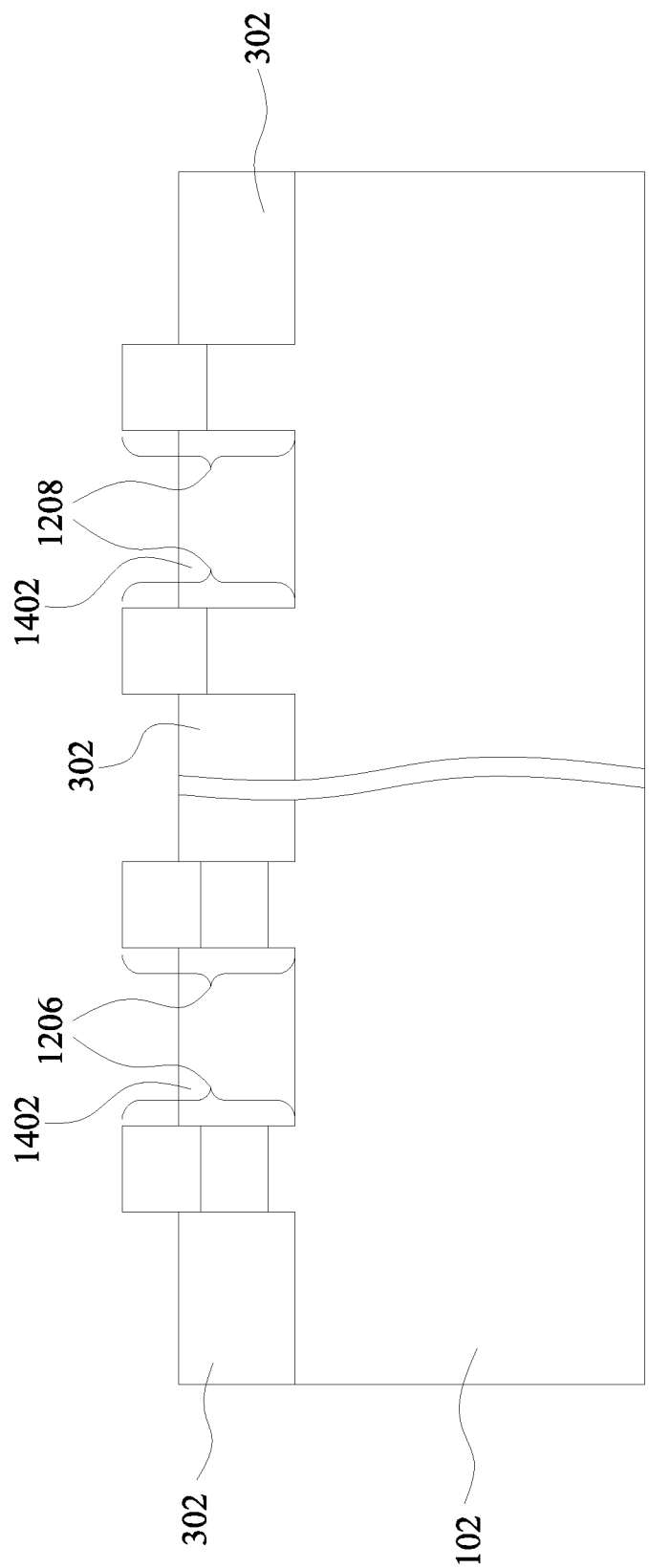

In FIG. 15 (step 1828 of FIG. 18), the first isolation regions 302 and the second isolation regions 1402 are recessed such that the first fins 1206 and the second fins 1208 protrude from between neighboring isolation regions 302 and 1402. The first isolation regions 302 and the second isolation regions 1402 may be recessed using an acceptable etching process, such as one that is selective to the material of the isolation regions. For example, a chemical oxide removal using a Tokyo Electron CERTAS or an Applied Materials SICONI tool or dilute hydrofluoric acid may be used.

Figure 16:
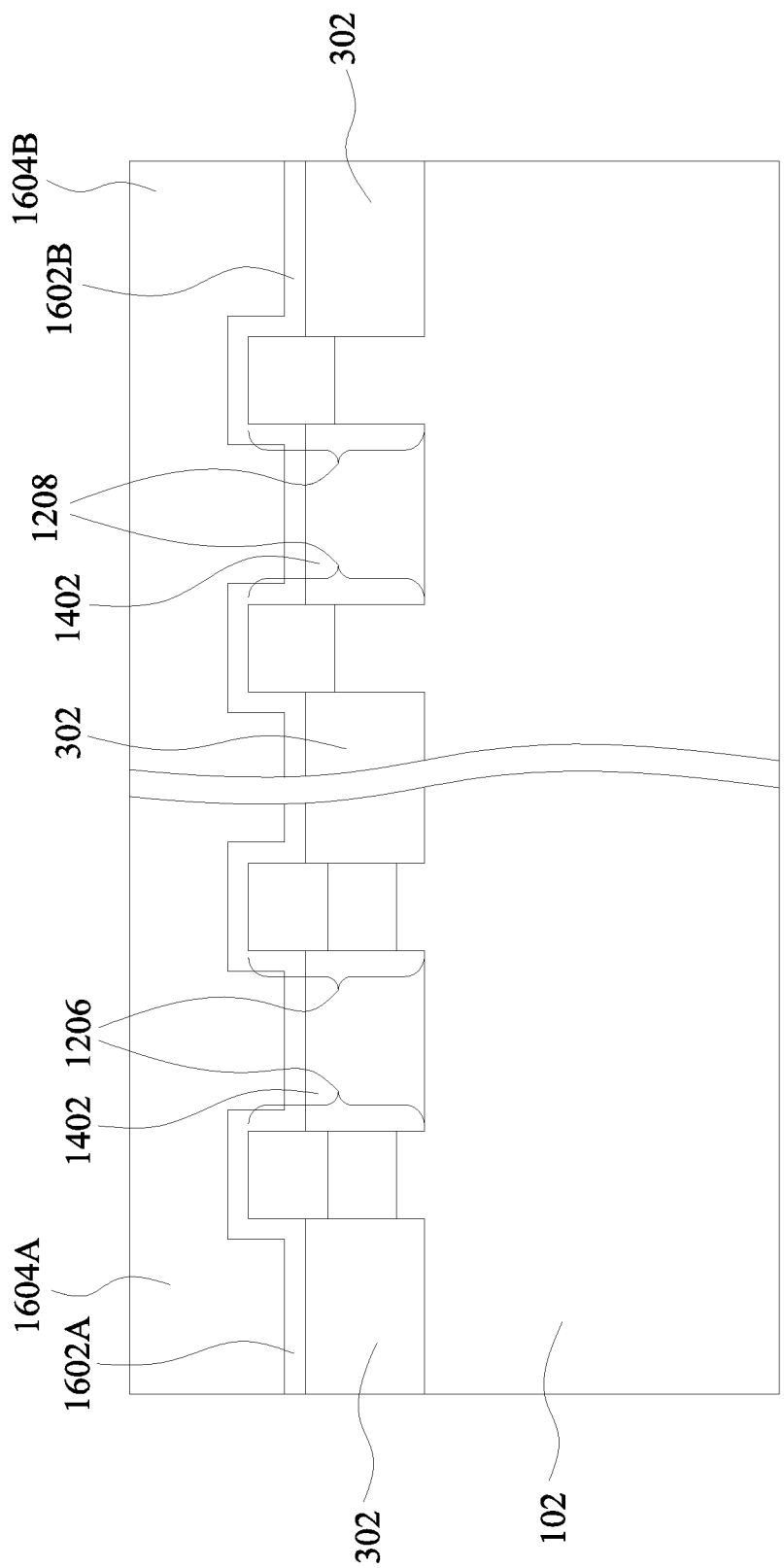
Figure 17:
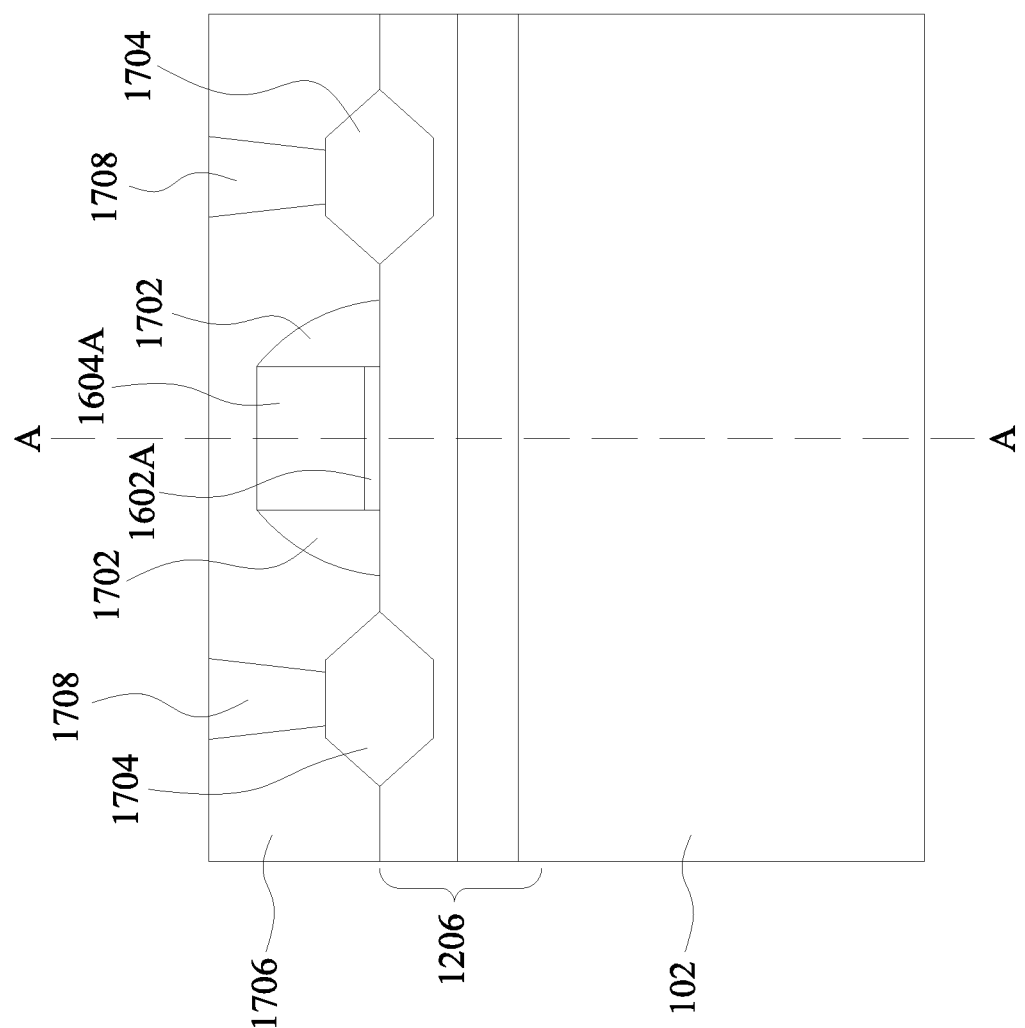

FIGS. 16 and 17 illustrate aspects of subsequent processing, such as in the forming of a field effect transistor (FET). These figures illustrate what may be referred to as a gate-first process. One having ordinary skill in the art will readily understand modifications for a gate-last or replacement gate process, which are contemplated by various embodiments.

In FIG. 16 (step 1830 of FIG. 18), gate dielectric layers 1602A and 1602B and gate electrodes 1604A and 1604B are formed on the fins 1206 and 1208. The gate dielectric layers 1602A and 1602B are deposited conformally, such as on the top surfaces and the sidewalls of the first fins 1206 and the second fins 1208, and on the top surfaces of the first isolation regions 302 and the second isolation regions 1402. In accordance with some embodiments, the gate dielectric layers 1602A and 1602B comprise silicon oxide, silicon nitride, or multilayers thereof. In other embodiments, the gate dielectric layers 1602A and 1602B comprise a high-k dielectric material, and in these embodiments, gate dielectric layer 1602 may have a k value greater than about 7.0, and may include a metal oxide or a silicate of Hf, Al, Zr, La, Mg, Ba, Ti, Pb, and combinations thereof. The formation methods of gate dielectric layers 1602A and 1602B may include Molecular-Beam Deposition (MBD), ALD, PECVD, and the like.

Next, the gate electrodes 1604A and 1604B are deposited over the gate dielectric layers 1602A and 1602B. The gate electrodes 1604A and 1604B may comprise a conductive material such as polysilicon, a metal, and a metal-containing material such as TiN, TaN, TaC, Co, Ru, Al, combinations thereof, or multi-layers thereof. After depositing the gate electrodes 1604A and 1604B, a CMP may be performed to planarize the material of the gate electrodes 1604A and 1604B. Once deposited and planarized, a gate may be formed by forming a mask and patterning the gate electrodes 1604A and 1604B and the gate dielectric layers 1602A and 1602B using an acceptable isotropic etching process, such as RIE, TCP, or the like. The resulting remaining portions of material of the gate electrodes 1604A and 1604B and the gate dielectric layers 1602A and 1602B thus form gates on the resulting FinFETs.

FIG. 17 shows a cross-sectional view of the structure perpendicular to the cross-sectional view in FIG. 16 after further processing. Cross-section A-A of previous figures is indicated in FIG. 17. In FIG. 17 (steps 1832-1838 of FIG. 18), gate spacers 1702 may be formed adjoining the patterned gate dielectric layers 1602A and gate electrodes 1604A. The gate spacers 1702 may be formed by conformally depositing a material and subsequently anisotropically etching the material. The material of the gate spacers 1702 may be silicon nitride, SiCN, a combination thereof, or the like.

Epitaxial source/drain regions 1704 are then formed in the first fins 1206. The epitaxial source/drain regions 1704 are formed such that the gate dielectric layers 1602A and the gate electrodes 1604A are disposed between respective neighboring pairs of the epitaxial source/drain regions 1704. The epitaxial source/drain regions 1704 may be formed by in the first region 102A, e.g., the NMOS region, by masking the second region 120B, e.g., the PMOS region, and etching the source/drain regions of the first fins 1206. The epitaxial source/drain regions 1704 are then epitaxially grown in the recesses. The epitaxial source/drain regions 1704 may comprise any acceptable material, such as material appropriate for n-type FinFETs. For example, the epitaxial source/drain regions 1704 may comprise silicon, SiC, SiCP, or the like. The epitaxial source/drain regions 1704 may have surfaces raised from respective surfaces of the first fins 1206 and may have facets.

An etch stop layer (not illustrated) may then be conformally formed. The etch stop layer may be formed by conformally depositing a material that may have a different etch selectivity than an immediately overlying material and an immediately underlying material. The material of the etch stop layer may be silicon nitride, SiCN, a combination thereof, or the like. An Inter-Layer Dielectric (ILD) 1706 is then formed. The ILD 1706 may be formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as chemical vapor deposition (CVD), and plasma-enhanced CVD (PECVD).

Contact 1708 are then formed through the ILD 1706 and etch stop layer, if present, to the epitaxial source/drain regions 1704. The openings may be formed using acceptable photolithography and etching techniques. Once the openings are formed, a contact material may then be deposited in the openings. A planarization process, such as a CMP, may be performed to remove excess contact material from a surface of the ILD 1706. Contacts 1708 are physically and electrically coupled to the epitaxial source/drain regions 1704.

Although the formation of an n-type device, such as an n-type FinFET, in first region 102A has been discussed, one having ordinary skill in the art will readily understand how to form a p-type device, such as a p-type FinFET, in a similar manner, e.g., in the second region 102B of the substrate 102. Further, one of ordinary skill in the art will readily understand other details of the formation that may have been omitted here, such as doping of appropriate components.

Although not explicitly shown, a person having ordinary skill in the art will readily understand that further processing steps may be performed on the structure in FIG. 17. For example, an etch stop layer may be formed over and adjoining the ILD. Inter-Metal Dielectrics (IMD) and their corresponding metallizations may be formed over the etch stop layer.

Embodiments may achieve advantages. By growing epitaxial regions in a trench and then etching the epitaxial region to form fins, the width of the resulting fins can be better controlled before forming the gate. Further, by epitaxially growing the channel such as discussed above, costs may be reduced. A risk of bending may also be reduced by growing an epitaxial region in a trench.

Growing an epitaxial region may result in defects at interfaces between the epitaxial region and regions containing oxides, such as the isolation regions. These defects may be defects in the crystalline structure such as stacking faults in the crystalline structure. These defects may be more likely to form when an epitaxial region is grown in a smaller trench, because smaller trenches may be difficult to clean efficiently before epitaxial growth. Growing an epitaxial region and forming fins by etching trenches may allow the fins to be formed without growing them in smaller, unclean trenches.

Further by first forming epitaxial regions and then forming fins by etching trenches into the epitaxial regions, some sidewalls of the resulting fins will comprise epitaxial material that did not interface with an oxide at the time of epitaxial growth. Further, by performing an end-cut, more surfaces that interfaced with an oxide during epitaxial growth may be removed. Fins formed by a previous method may have a density of defects greater than some embodiments. These defects can be exacerbated during back-end processing, resulting in lower quality of the resulting device. According to some embodiments, fins formed by etching a trench in an epitaxial region and performing an end-cut, such as fins 1206 and 1208, and more particularly portions of the second crystalline layer 506 in the first fins 1206 and portions of the third crystalline layer 704 in the second fins 1208, may have a density of stacking fault defects less than $10^5$ cm$^{-3}$, such as less than $10^4$ cm$^{-3}$, like between $10^3$ cm$^{-3}$ and $10^4$ cm$^{-3}$.

According to an embodiment, a method comprises forming first trenches in a substrate; forming first isolation regions in the first trenches; epitaxially growing an epitaxial region between the first isolation regions; etching the epitaxial region into a plurality of fins, the etching forming a second trench; and forming a second isolation region in the second trench.

According to another embodiment, a method comprises forming a plurality of fins on a substrate, forming a gate dielectric layer over the plurality of fins, and forming a gate electrode over the gate dielectric layer. Forming the plurality of fins comprises forming first isolation regions in the substrate, forming a recess between the first isolation regions, epitaxially growing an epitaxial region in the recess, forming a trench in the epitaxial region, and forming second isolation region in the trench.

According to a further embodiment, a structure comprises a substrate, a first fin on the substrate, a gate dielectric over the first fin, and a gate electrode over the gate dielectric. The substrate comprises a first crystalline material. The first fin comprises a first epitaxial layer having a stacking fault defect density less than $1*10^4$ cm$^{-3}$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming first trenches in a substrate;
   forming first isolation regions in the first trenches;
   epitaxially growing an epitaxial region between the first isolation regions;
   forming a fin mask over the epitaxial region;
   etching the epitaxial region into a plurality of fins using the fin mask as a mask for the etching, the etching forming a second trench in the epitaxial region, the epitaxial region and each of the plurality of fins having the same material composition; and
   forming a second isolation region in the second trench.

2. The method of claim 1, wherein etching the epitaxial region into the plurality of fins comprises:
   forming a mandrel over the epitaxial region;
   depositing a dielectric layer conformally on the mandrel;
   removing horizontal portions of the dielectric layer, remaining vertical portions of the dielectric layer being over the epitaxial region, the vertical portions of the dielectric layer forming the fin mask;
   removing the mandrel; and
   removing portions of the epitaxial region exposed by the vertical portions of the dielectric layer.

3. The method of claim 2, wherein forming the mandrel over the epitaxial region comprises:
   depositing a mandrel layer over the substrate;
   forming a photoresist portion on the mandrel layer and over the epitaxial region, wherein a width of the photoresist portion is less than a width of the epitaxial region; and
   removing a portion of the mandrel layer not under the photoresist portion.

4. The method of claim 1, further comprising removing an end from each of the plurality of fins along longitudinal axes of each of the plurality of fins in a plan view.

5. The method of claim 4, wherein removing the end of each of the plurality of fins comprises removing between 10 nm and 1 µm from each of the plurality of fins.

6. The method of claim 1, wherein epitaxially growing the epitaxial region between the first isolation regions comprises epitaxially growing a first crystalline layer over the substrate, the first crystalline layer being lattice mismatched to a material of the substrate.

7. The method of claim 6, wherein epitaxially growing the epitaxial region further comprises growing a second crystalline layer over the first crystalline layer, the first crystalline layer comprising SiGe, the second crystalline layer comprising Si.

8. A method comprising:
   forming a plurality of fins on a substrate comprising:
   forming first isolation regions in the substrate;

forming a recess between the first isolation regions;
epitaxially growing an epitaxial region in the recess;
forming a plurality of dielectric masks over the epitaxial region;
removing a portion of the epitaxial region, remaining portions of the epitaxial region forming the plurality of fins, the removing comprising forming a trench in the epitaxial region using the dielectric masks as an etch mask; and
forming second isolation region in the trench;
forming a gate dielectric layer over the plurality of fins; and
forming a gate electrode over the gate dielectric layer.

9. The method of claim 8, wherein forming the plurality of fins on the substrate further comprises removing an end from a portion of the epitaxial region in a plan view.

10. The method of claim 9, wherein removing the end from the epitaxial region comprises removing between about 10 nm and about 1 μm from the end of the epitaxial region.

11. The method of claim 8, wherein epitaxially growing the epitaxial region in the recess comprises epitaxially growing a semiconductor material, the semiconductor material being lattice mismatched to a material of the substrate.

12. The method of claim 8, wherein epitaxially growing the epitaxial region in the recess comprises growing a first crystalline layer over the substrate and a second crystalline layer over the first crystalline layer, the first crystalline layer comprising SiGe, the second crystalline layer comprising Si.

13. A method comprising:
forming first trenches in a substrate;
forming first isolation regions in the first trenches;
epitaxially growing an epitaxial region between the first isolation regions;
forming a mandrel over the epitaxial region;
conformally depositing a dielectric layer on the mandrel;
removing the mandrel and portions of the dielectric layer to form a plurality of fin masks, each one of the plurality of fin masks disposed over the epitaxial region;
etching a second trench in the epitaxial region between each one of the plurality of fin masks; and
forming a second isolation region in the second trench.

14. The method of claim 13, wherein epitaxially growing the epitaxial region comprises epitaxially growing a first epitaxial layer on the substrate, the first epitaxial layer being lattice mismatched to the substrate.

15. The method of claim 14, wherein first epitaxial layer comprises SiGe.

16. The method of claim 13, wherein epitaxially growing the epitaxial region comprises epitaxially growing a first epitaxial layer on the substrate and a second epitaxial layer on the first epitaxial layer.

17. The method of claim 16, wherein the first epitaxial layer is relaxed, and the second epitaxial layer is lattice mismatched to the first epitaxial layer.

18. The method of claim 16, wherein first epitaxial layer comprises SiGe.

19. The method of claim 13, further comprising removing an end from a portion of the epitaxial region after etching the second trench in the epitaxial region.

20. The method of claim 13, wherein the epitaxial region has a stacking fault defect density less than $1*10^4$ cm$^{-3}$ after etching the second trench in the epitaxial region.

* * * * *